US008836726B1

(12) United States Patent
Schickler

(10) Patent No.: US 8,836,726 B1
(45) Date of Patent: Sep. 16, 2014

(54) AUTOMATIC SCALING OF AXES FOR DISPLAYING MOVING DATA

(75) Inventor: Jason Jeffrey Schickler, Natick, MA (US)

(73) Assignee: The MathWorks, Inc., Natick, MA (US)

(*) Notice: Subject to any disclaimer, the term of this patent is extended or adjusted under 35 U.S.C. 154(b) by 949 days.

(21) Appl. No.: 12/720,829

(22) Filed: Mar. 10, 2010

Related U.S. Application Data

(60) Provisional application No. 61/266,793, filed on Dec. 4, 2009.

(51) Int. Cl.
*G09G 5/00* (2006.01)
*G01R 13/00* (2006.01)

(52) U.S. Cl.
USPC .......................................... 345/660; 702/66

(58) Field of Classification Search
CPC ............. G09G 2340/0407; G09G 2340/0414; G06T 3/40; G06F 3/0481; G06F 2203/04806; G01R 13/029; G01R 19/2506; G01R 13/02; G01R 19/25

USPC ......................................................... 345/660
See application file for complete search history.

(56) References Cited

U.S. PATENT DOCUMENTS

| 5,155,431 | A | * | 10/1992 | Holcomb .................. 324/121 R |
| 5,684,507 | A | * | 11/1997 | Rasnake et al. ............ 345/440.1 |
| 6,356,849 | B1 | * | 3/2002 | Jaffe .............................. 702/66 |
| 2002/0080149 | A1 | * | 6/2002 | Alexander et al. ............ 345/634 |
| 2010/0053154 | A1 | * | 3/2010 | Horvitz et al. ................ 345/419 |

* cited by examiner

*Primary Examiner* — David Zarka
*Assistant Examiner* — Andrew J Gill
(74) *Attorney, Agent, or Firm* — Nelson Mullins Riley & Scarborough LLP

(57) ABSTRACT

Exemplary embodiments can include methods, devices, and executable instructions for autoscaling displays containing moving data (e.g., data that changes with respect to time). Embodiments make use of counters and an algorithm to autoscale a display in a manner that can approximate the behavior of a user. For example, embodiments may autoscale a display under conditions that would cause a typical user to manually autoscale the display.

17 Claims, 20 Drawing Sheets

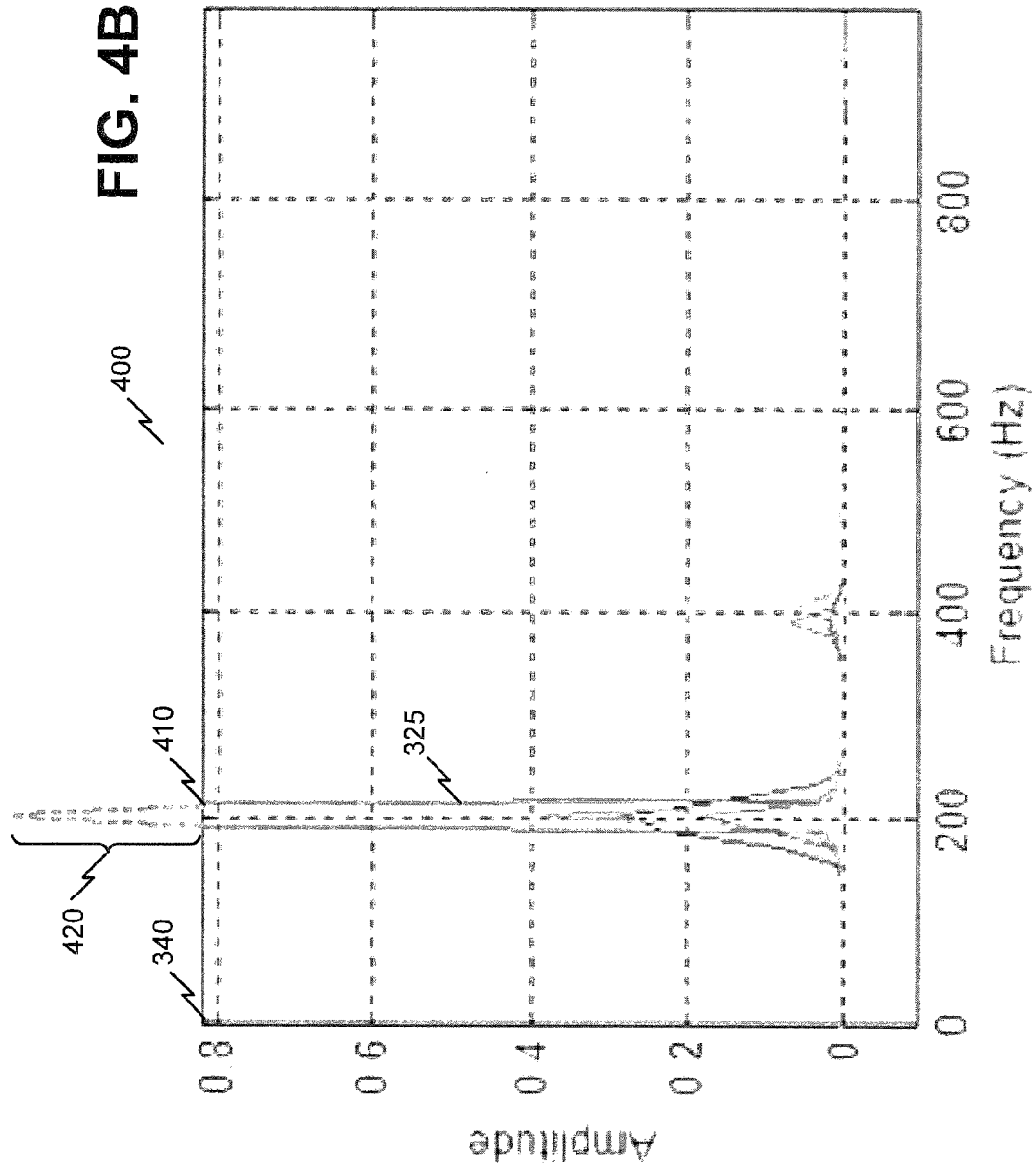

AUTOMATIC SCALING OF AXES FOR DISPLAYING MOVING DATA

RELATED APPLICATIONS

The instant application claims priority to U.S. Provisional Patent Application No. 61/266,793 filed Dec. 4, 2009, the contents of which are incorporated by reference herein in their entirety.

BACKGROUND INFORMATION

Models may be used to simulate physical systems. For example, a graphical model may be used to represent a complex control system for a plant. The graphical model may include entities, such as blocks, that reference executable code for performing operations of the control system when the graphical model executes. The blocks can vary in type and/or number and may be connected together to build large, complex models (e.g., models including hundreds or more interconnected blocks).

At times, a user may wish to observe how a portion of the model is operating. One technique for observing model operation involves using a scope display in the model. The scope display allows the user to observe moving data with respect to an x and y-axis. For example, the y-axis may indicate the amplitude of a signal and the x-axis may indicate time or frequency for the signal.

Users may set limits for the x and y axes on the scope based on expected characteristics of the signal. Often a user's guess with respect to signal characteristics may be wrong, and the signal amplitude my exceed an upper or lower limit of the display. At other times, the user may set upper/lower limits that are much larger than the signal amplitude thus making the signal difficult to observe. Conventional scopes may autoscale as soon as an out-of-range sample is detected. For example, when the amplitude of a sample exceeds the upper limit of the scope, the scope rescales so that the sample can be seen. If a subsequent sample exceeds the rescaled upper limit, the scope rescales again. When signals do not exceed the upper limit, the scope may rescale again to make the displayed signal occupy the full display area of the scope.

At times the scope may rescale so frequently that a user becomes frustrated with the autoscaling capability of the scope. For example, the user may become frustrated because the display rescales so frequently that the user does not have time to interpret the displayed signal before the signal rescales again. In these situations, a user may place the scope into a manual mode which may result in signal data not being displayed when a sample is out of range, or signal data being displayed without adequate resolution when the signal is small with respect to the available display area of the scope.

The shortcomings associated with conventional autoscaling techniques for use with moving data may interfere with a user's ability to efficiently assess whether a model is performing in an expected manner.

BRIEF DESCRIPTION OF THE DRAWINGS

The accompanying drawings, which are incorporated in and constitute a part of this specification, illustrate one or more embodiments of the invention and, together with the description, explain the invention. In the drawings.

FIG. 4B illustrates the exemplary scope display of FIG. 4A along with the out-of-range portion of a signal;

DETAILED DESCRIPTION

Figure 1:
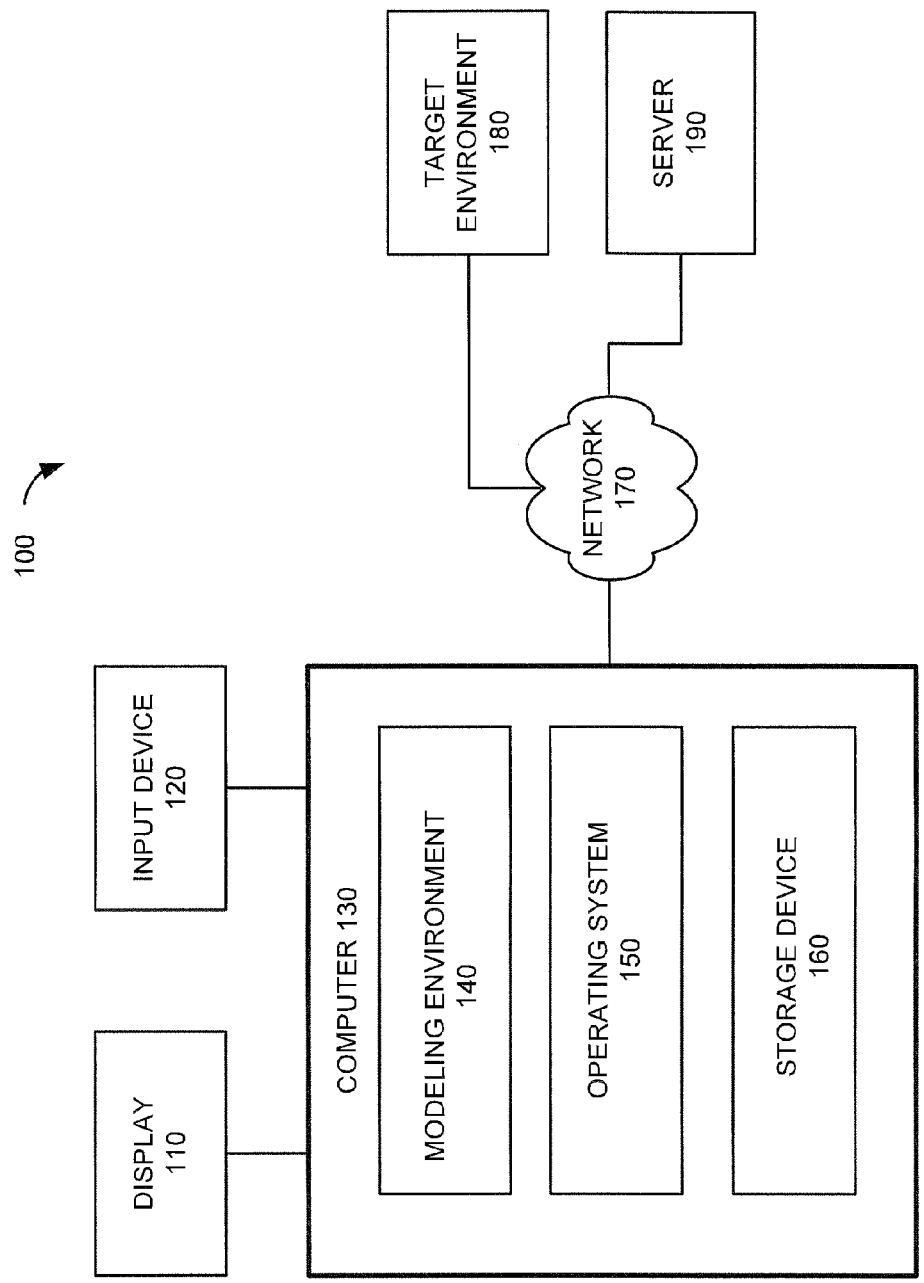
FIG. 1 illustrates an exemplary system for practicing an exemplary embodiment.

The following detailed description of implementations consistent with principles of the invention refers to the accompanying drawings. The same reference numbers in different drawings may identify the same or similar elements. Also, the following detailed description does not limit the invention. Instead, the scope of the invention is defined by the appended claims and their equivalents.

Overview

Exemplary embodiments perform autoscaling of axes for displays containing moving data. Moving data may include any type of dynamic data that changes over time. For example, moving data can include discrete or continuous data. By way of example, a scope block may be placed into a graphical model and coupled to an output of another block in the model. The scope block may provide a user with a scope display that can be used to view signals output by the monitored block. The scope display may display moving data (i.e., data that changes as the model executes). When data in the scope display exceeds an upper limit or a lower limit, the scope display may autoscale to allow out-of-range values to be displayed to the user. Exemplary embodiments are discussed in connection with scopes and/or scope displays; however, embodiments of the invention can be used with substantially any type of data visualization tool, e.g., other types of moving data displays.

Autoscaling as used with embodiments of the invention differs from conventional autoscaling techniques in several ways. A first difference is that exemplary embodiments perform autoscaling in a way that represents the behavior of a user, e.g., when and/or how a user would autoscale moving data. For example, a user may not be inclined to autoscale a display when only a single sample is out-of-range because doing so may cause the display to rapidly autoscale with each sample that is out-of-range (either exceeding an upper limit of the display or a lower limit of the display). Instead, the user may be inclined to leave a display setting where it is if only an occasional sample is out-of-range. However, the user may wish to autoscale the display when a certain number of samples in a row are out-of-range, when a certain percentage of samples are out-of-range, etc.

Exemplary embodiments include techniques for comparing a number of samples exceeding an upper or lower limit against a counter threshold value that represents a total number of samples. Aspects of the comparison can be configured to approximate the behavior of a user with respect to when and under what conditions a display should be autoscaled.

A second difference is that a display can be configured to autoscale in only one direction. For example, a user may make a selection that causes the display to only zoom out (e.g., making a displayed waveform occupy a smaller portion of a display area). Making this selection will cause samples exceeding an upper or lower limit to autoscale the display when a determined number samples have exceeded the upper/lower limits. In contrast, if displayed data is only occupying a small portion of the available display area, the display may not autoscale to zoom in on the displayed data.

A third difference is that an algorithm can be used to control autoscaling of displayed data, where the algorithm includes hysteresis and further accounts for the age of monitored data. The algorithm may weight recent data more heavily than older data so that display characteristics are more representative of recent data. Characteristics of the algorithm can be tuned to provide desirable autoscaling characteristics to the user. In an embodiment, a user can specify weighting characteristics for the algorithm to control how data is displayed and autoscaled.

A fourth difference is that exemplary embodiments can provide a user with one or more interfaces for use in configuring properties of a scope display. For example, embodiments may provide the user with command line interfaces or graphical user interfaces (GUIs) for configuring a scope display. Embodiments may allow the user to specify whether autoscaling should be used, whether a display should only zoom out, specify a percentage of available display area that should be occupied by displayed signals, and how displayed data should be aligned (e.g., center, bottom, top, etc., of the display area).

Exemplary System

FIG. 1 illustrates an exemplary system 100 for practicing an embodiment. For example, system 100 may be used to construct textual or graphical models that include one or more entities, to execute the models, to insert scope displays into models, to generate code from the models, etc. System 100 may include display 110, input device 120, computer 130, network 170, target environment 180 and server 190. The system in FIG. 1 is illustrative and other embodiments of system 100 can include fewer devices, more devices, and/or devices in configurations that differ from the configuration of FIG. 1.

Display 110 may include a device that displays information to a user. Display 110 may include a cathode ray tube (CRT), plasma display device, light emitting diode (LED) display device, liquid crystal display (LCD) device, etc. Embodiments of display 110 may be configured to receive user inputs (e.g., via a touch sensitive screen) when desired. In an embodiment, display 110 can display one or more graphical user interfaces (GUIs) to a user. The GUIs may display a model, inputs for a model (e.g., user specified objectives, constraints, display characteristics, etc.), model outputs, and/or other types of information to a user.

Input device 120 may include logic to receive input from a user. For example, input device 120 may transform a user motion or action into a signal or message that can be interpreted by computer 130. Input device 120 can include, but is not limited to, keyboards, pointing devices, biometric devices, accelerometers, microphones, cameras, haptic devices, etc. In an embodiment, input device 120 may receive inputs from a user configuring an autoscaling algorithm for use with moving data. The embodiment may further allow the user to set axis limits for a display used to view dynamic data using a command line interface and/or a graphical interface. Display 110 may display results of the models to the user when the models execute.

Computer 130 may include a device that performs processing operations, display operations, communication operations, etc. For example, computer 130 may include logic, such as one or more processing or storage devices, that can be used to perform and/or support processing activities on behalf of a user. Embodiments of computer 130 may include a desktop computer, a laptop computer, a client, a server, a mainframe, a personal digital assistant (PDA), a web-enabled cellular telephone, a smart phone, smart sensor/actuator, or another computation or communication device that executes instructions to perform one or more activities and/or to generate one or more results.

Computer 130 may further perform communication operations by sending data to or receiving data from another device, such as server 190. Data may refer to any type of machine-readable information having substantially any format that may be adapted for use in one or more networks and/or with one or more devices. Data may include digital information or analog information. Data may further be packetized and/or non-packetized.

An embodiment of computer 130 may include modeling environment 140, operating system 150, and storage device 160. Modeling environment 140 may provide a computing environment that allows users to perform simulation or modeling tasks related to disciplines, such as, but not limited to, mathematics, science, engineering, medicine, business, etc. Modeling environment 140 may support one or more applications that execute instructions to allow a user to construct a model having executable semantics. In an embodiment, modeling environment 140 may execute the model to produce a result.

Models used with exemplary embodiments of the invention may include information in a textual or graphical form. For example, a model may be a textual model or graphical model that can be time-based model (e.g., differential equation models, difference equation models, discrete-time models, or continuous-time models with or without algebraic constraints, etc.), event-based model, state transition model, data flow model, component diagram, entity flow diagram, equation-based language diagram, etc.

Operating system 150 may manage hardware and/or software resources associated with computer 130. For example, operating system 150 may manage tasks associated with receiving user inputs, operating computer 130, allocating memory, prioritizing system requests, etc. In an embodiment, operating system 150 may be a virtual operating system. Embodiments of operating system 150 may include Linux, Mac OS, Microsoft Windows, Solaris, UNIX, etc. Operating system 150 may further run on a virtual machine, which can be provided by computer 130.

Storage device 160 may include a magnetic, solid state and/or optical recording medium and its corresponding drive, or another type of static storage device that may store static information and/or instructions for use by computer 130. Exemplary embodiments of storage device can include random access memory (RAM) or another type of dynamic storage device that may store information and instructions for execution by processing logic operating in computer 130. Storage device 160 may further include read only memory (ROM), and/or other types of static storage.

Network 170 may include any network capable of transferring data (e.g., packet data or non-packet data). Implementations of network 170 may include local area networks (LANs), metropolitan area networks (MANs) and/or wide area networks (WANs), such as the Internet, that may operate using substantially any network protocol, such as Internet protocol (IP), asynchronous transfer mode (ATM), synchronous optical network (SONET), user datagram protocol (UDP), IEEE 802.10, etc.

Network 170 may include network devices, such as routers, switches, firewalls, and/or servers (not shown). Network 170 may be a hardwired network using wired conductors and/or optical fibers and/or may be a wireless network using free-space optical, radio frequency (RF), and/or acoustic transmission paths. In an implementation, network 170 may be a substantially open public network, such as the Internet. In another implementation, network 170 may be a more restricted network, such as a corporate virtual network. Implementations of networks and/or devices operating on networks described herein are not limited to any particular data type, protocol, architecture/configuration, etc. For example, in an embodiment, network 170 may be a quantum network that uses quantum-compatible networking protocols.

Target environment 180 may include logic that executes instructions to perform one or more operations. In an embodiment, target environment 180 can include processing logic adapted to execute code generated from one or more models. In an embodiment, target environment 180 can include real-time logic for performing processing operations in real-time. For example, target environment 180 may include a real-time operating system and hardware that are configured to process received signals or events in real-time or to execute simulations in real-time.

Exemplary embodiment of target environment 180 can include field programmable gate arrays (FPGAs), application specific integrated circuits (ASICs), application specific instruction-set processors (ASIPs), digital signal processors (DSPs), graphics processor units (GPUs), programmable logic devices (PLDs), etc. Target environments 180 can further include a single processor that includes two or more types of logic, such as cores. Target environments 180 can be configured to support multi-threaded or multi-process applications using FPGAs, ASICs, ASIPs, DSPs, GPUs, PLDs, cores, etc.

Server 190 may include a device that receives data from, and sends data to, another device and/or network. For example, server 190 may include one or more server devices/computers (e.g., a workstation, mainframe, desktop computer, laptop computer, PDA, web enabled cellular telephone, smart phone, Wi-Fi device, smart sensor/actuator, or another type of device). Server 190 may be implemented as a standalone device, a distributed arrangement of devices (e.g., a cluster or pool of devices) arranged in substantially any type of configuration (e.g., star, ring, grid, etc.). Distributed implementations of server 190 may further include devices, such as load balancers, schedulers, network devices, etc., to allow distributed implementations of server 190 to operate in a determined manner. In one implementation, server 190 may provide a service to other devices in system 100, such as computer 130. For example, server 190 may provide remote processing services to computer 130 via network 170.

Exemplary Modeling Environment

Figure 2:
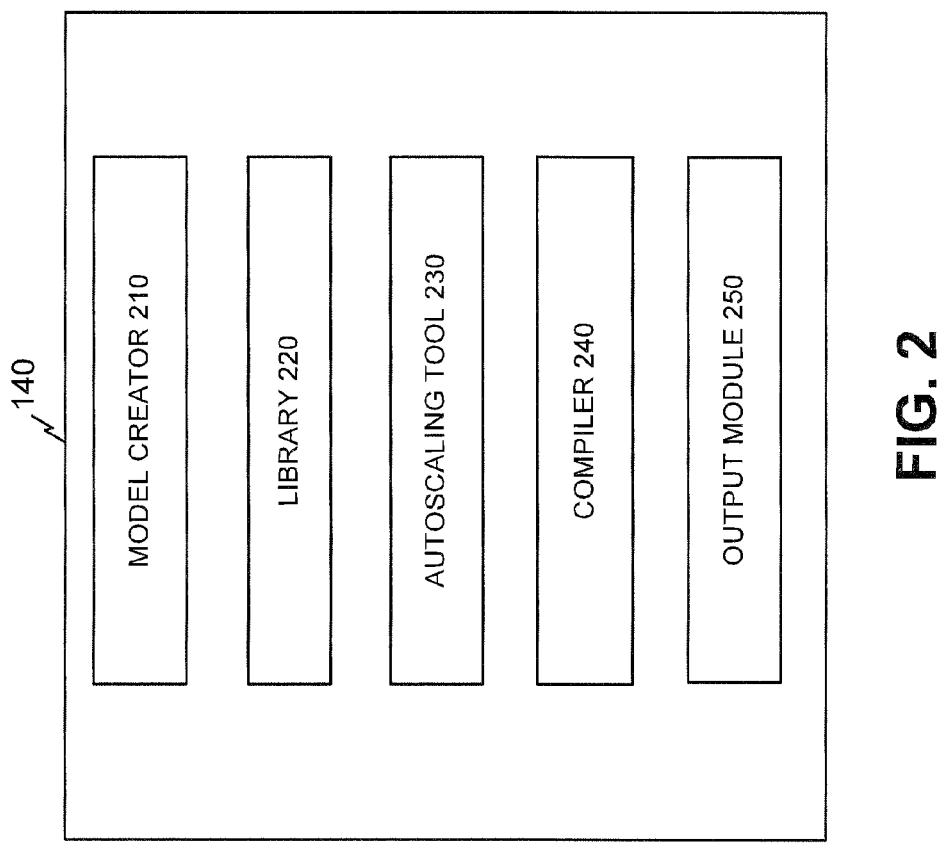
FIG. 2 illustrates an exemplary embodiment of a modeling environment.

FIG. 2 illustrates an exemplary embodiment of a modeling environment 140. Modeling environment 140 can include model creator 210, library 220, autoscaling tool 230, compiler 240, and output module 250. The embodiment of modeling environment 140 illustrated in FIG. 2 is illustrative and other embodiments of modeling environment 140 can include more entities or fewer components without departing from the spirit of the invention.

Model creator 210 may be an application for building a model. Model creator 210 can be used to build a textual model or a graphical model having executable semantics. In the case of graphical models, model creator 210 may allow users to create, modify, diagnose, delete, etc., model entities and/or connections. For example, model creator 210 may display a canvas onto which a user can place blocks, connections, etc., for creating a model of a dynamic system. Model creator 210 may interact with other entities illustrated in FIG. 1 or 2 for receiving user inputs, executing a model, displaying results, generating code, etc.

Library 220 may include code modules or entities, e.g., blocks/icons, and/or connections (e.g., lines) that a user can drag and drop onto a canvas that includes a model. In the case of graphical models, a user may further couple entities obtained from the library using connections to produce a graphical model of a system. For example, a user may drag a scope block from library 220 and may drop the scope at a location in a graphical model.

Autoscaling tool 230 may include hardware and/or software for allowing a user to specify autoscaling characteristics of moving data. In an embodiment, autoscaling tool 230 may include code for receiving user inputs specifying criteria for use in autoscaling signals displayed on a scope in a model. Autoscaling tool 230 may further allow a user to weight criteria according to the relative importance of criteria to the user. Autoscaling tool 230 may include one or more algorithms that perform autoscaling with respect to moving data in the model. The algorithms may be configured to represent typical user behaviors with respect to when and how to autoscale moving data in the model.

Compiler 240 may compile a model into an executable format. Compiled code produced by compiler 240 may be executed on computer 130 to produce a modeling result. In an embodiment, compiler 240 may also provide a user with debugging capabilities for diagnosing errors associated with the model and profiling capabilities for analyzing performance characteristics. Embodiments of compiler 240 may interact with autoscaling tool 230 to, for example, allow assessment tool 230 to store information related to compiler switch settings used to compile a model.

Output module 250 may include code for generating one or more outputs from a model when the model is executed. For example, output module 250 may display a model, a modeling result, etc., to a user via display 110. In an embodiment, output module 250 may create a graphical user interface (GUI) for displaying information to a user. Output module 250 may further produce other types of output from a model, such as generated code. In an embodiment, generated code can be configured for execution in target environment 180, which may be, for example, an embedded system.

Exemplary Scope Displays

Figure 3:
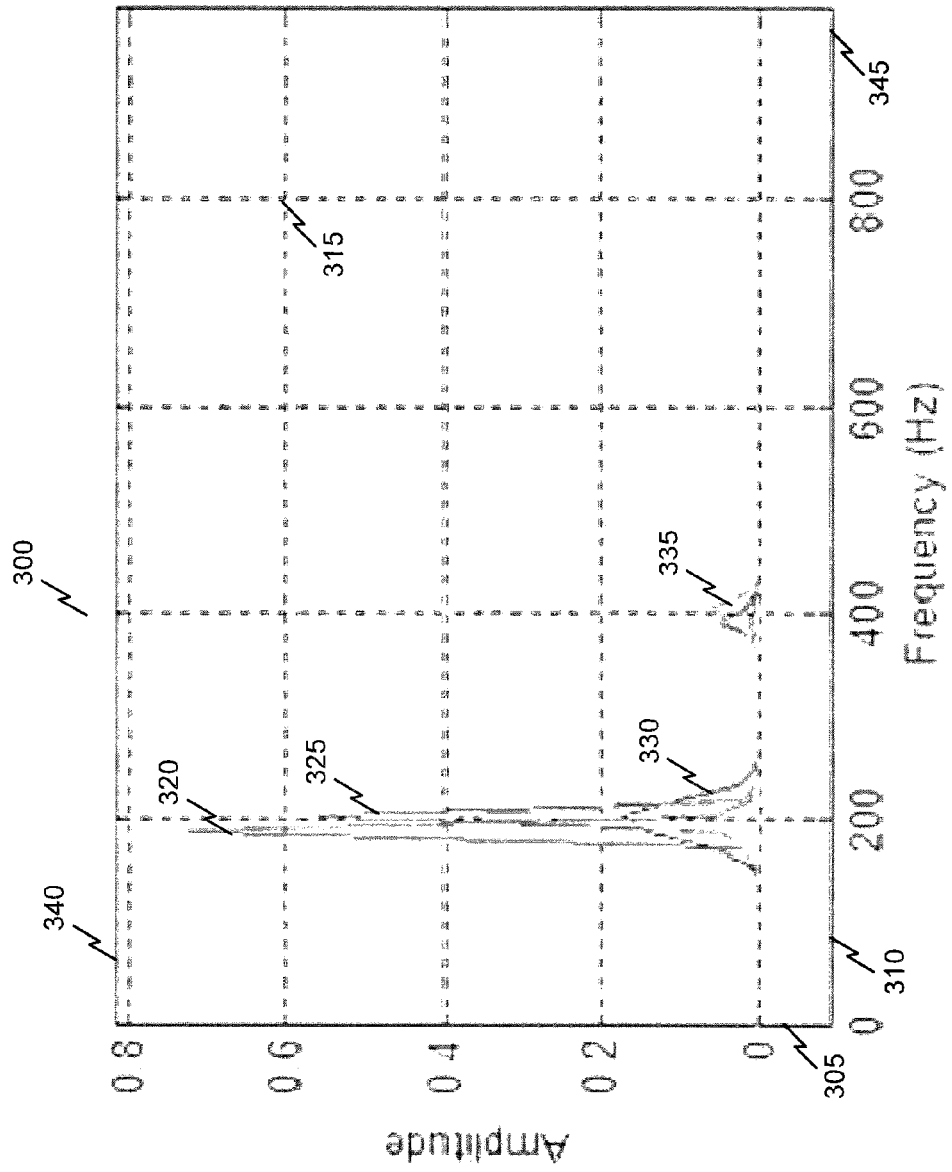
FIG. 3 illustrates an exemplary scope display for viewing signals in a model.

FIG. 3 illustrates an exemplary scope display 300 for viewing signals in a model. The display of FIG. 3 is illustrative and other embodiments can have displays configured differently, e.g., displays using x, y and z axes, polar coordinates, etc. Display 300 may include y-axis 305, x-axis 310, grid 315, signal traces 320, 325, 330 and 335, upper limit 340, and lower limit 345. Y-axis 305 may be used to indicate the amplitude of traces 320, 325, 330 and 335. Embodiments can include linear, logarithmic, etc., scales for indicating data displayed with respect to y-axis 305. In an embodiment, data displayed with respect to y-axis 305 may have an upper limit 340 indicating a maximum value on display 300 and a lower limit 345 indicating a minimum value on display 300. Data exceeding upper limit 340 or lower limit 345 may not be visible on display 300 and may be referred to as out-of-range data, out-of-range samples, out-of-range values, etc.

Display 300 may further include an x-axis 310 that may display traces 320, 325, 330, and 335 with respect to, for example, time, frequency, etc. Display 300 may include grid 315, which may be comprised of lines to aid a user in determining x and y values for data in display 300. Data displayed via traces 320, 325, 330 and 335 in display 300 may be referred to as in-range or correctly scaled because minimum and maximum values for traces 320, 325, 330 and 335 are displayed within a display area of display 300 (i.e., displayed between upper limit 340 and lower limit 345).

Figure 4A:
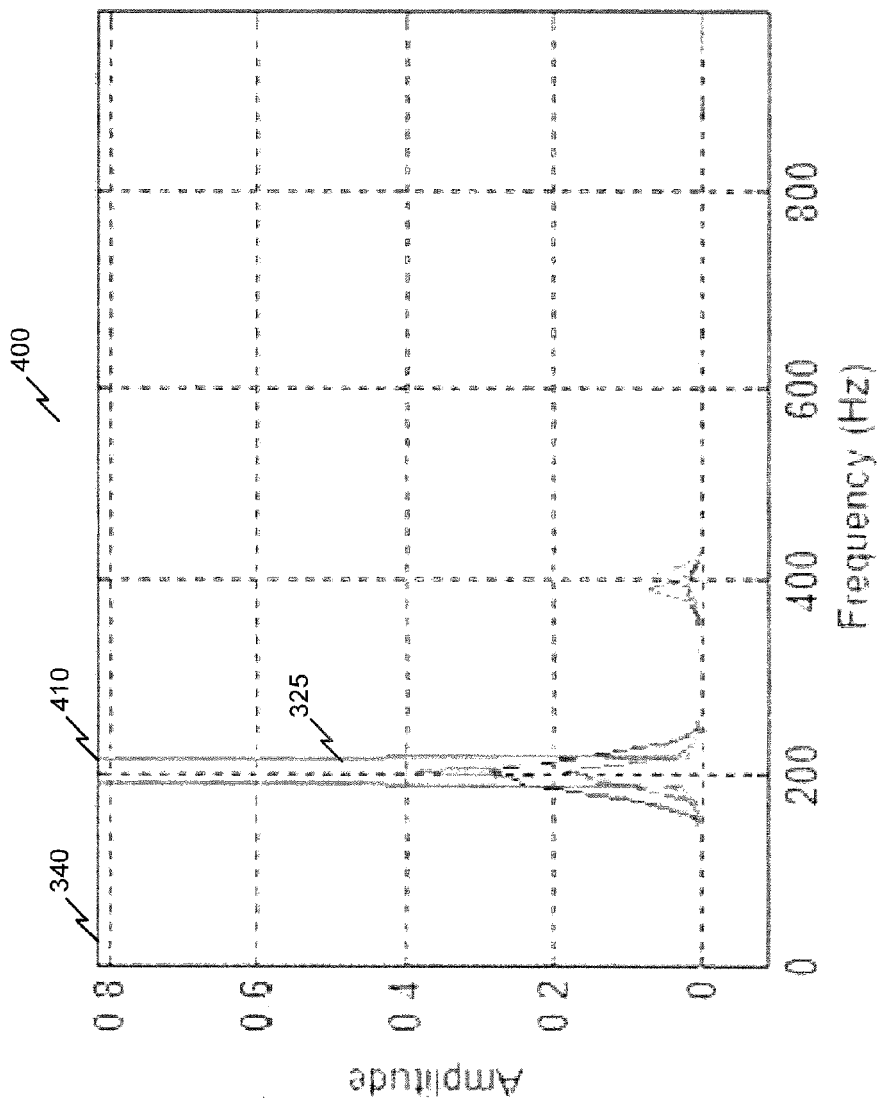
FIG. 4A illustrates an exemplary scope display containing an out-of-range signal.

FIG. 4A illustrates an exemplary scope display 400 containing an out-of-range signal. Display 400 may include traces 320, 325, 330, and 335 at a time subsequent to that of FIG. 3. In display 400, trace 325 may have an amplitude that exceeds the amplitude of trace 325 in FIG. 3 and that further exceeds upper limit 340. For example, trace 325 may have a clipping point 410 indicates a location beyond which an amplitude of trace 325 cannot be viewed using a current setting of display 400. When a signal exceeds upper limit 340 or lower limit 345, the signal may be said to be clipped or to have exceeded a range of display 400. Scope displays may not display clipped portions of a signal unless some type of autoscaling technique is employed.

FIG. 4B illustrates the exemplary scope display of FIG. 4A along with the out-of-range portion of trace 325. Clipped portion 420 is shown via a dashed line in FIG. 4B and may not be visible to a user. As a result, a user cannot determine the exact amplitude of trace 325 unless display 400 is rescaled so that upper limit 340 exceeds the maximum amplitude for trace 325.

Figure 5:
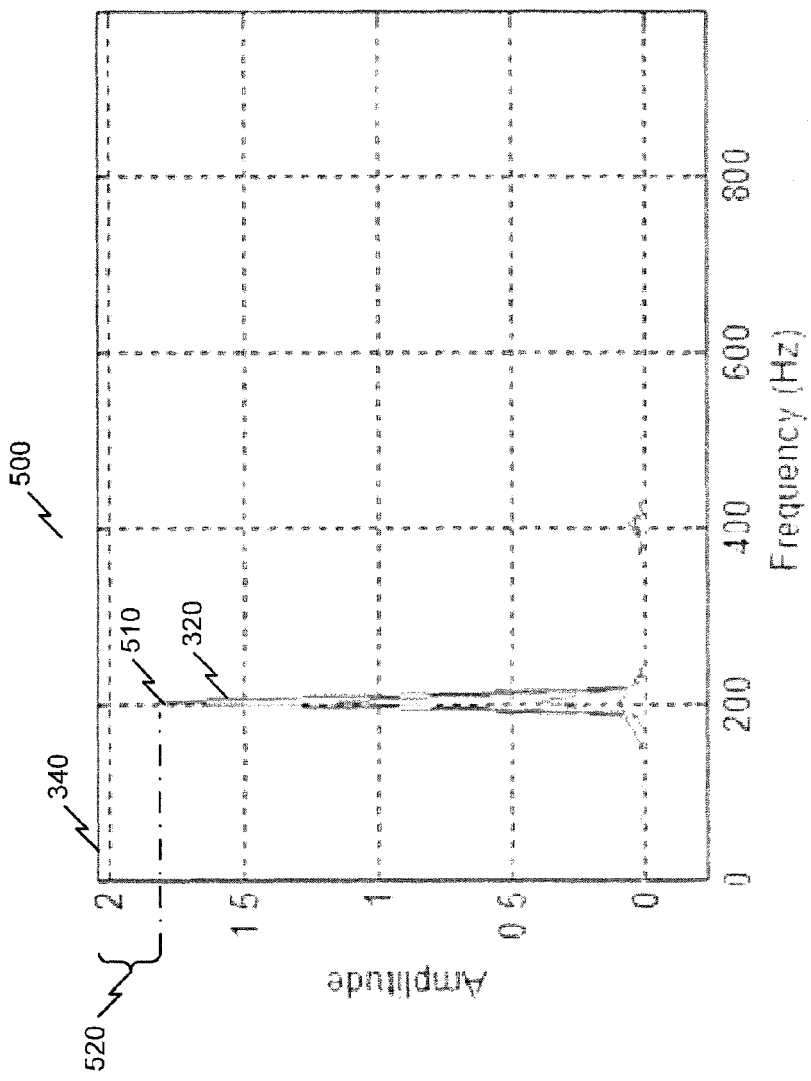
FIG. 5 illustrates an exemplary scope display showing a limit margin.

FIG. 5 illustrates an exemplary scope display showing a limit margin 520. When an exemplary embodiment detects a trace exceeding upper limit 340, an algorithm may be used to determine whether a scope display should be rescaled. In an embodiment, display 500 includes rescaled traces that eliminate clipped portions. For example, the maximum value of the y-axis of FIG. 4B was 0.8 and the maximum value of the y-axis of FIG. 5 is 2.0. In FIG. 5, trace 320 has the largest amplitude (peak 510), which is shown within display 500. The algorithm may re-draw display 500 so as to maintain limit margin 520 between peak 510 and upper limit 340. Embodiments may configure limit margin 520 to be a determined number of units above peak 510 (e.g., 0.25 units), a determined percentage of a total display area (e.g., 15%), etc.

Figure 6:
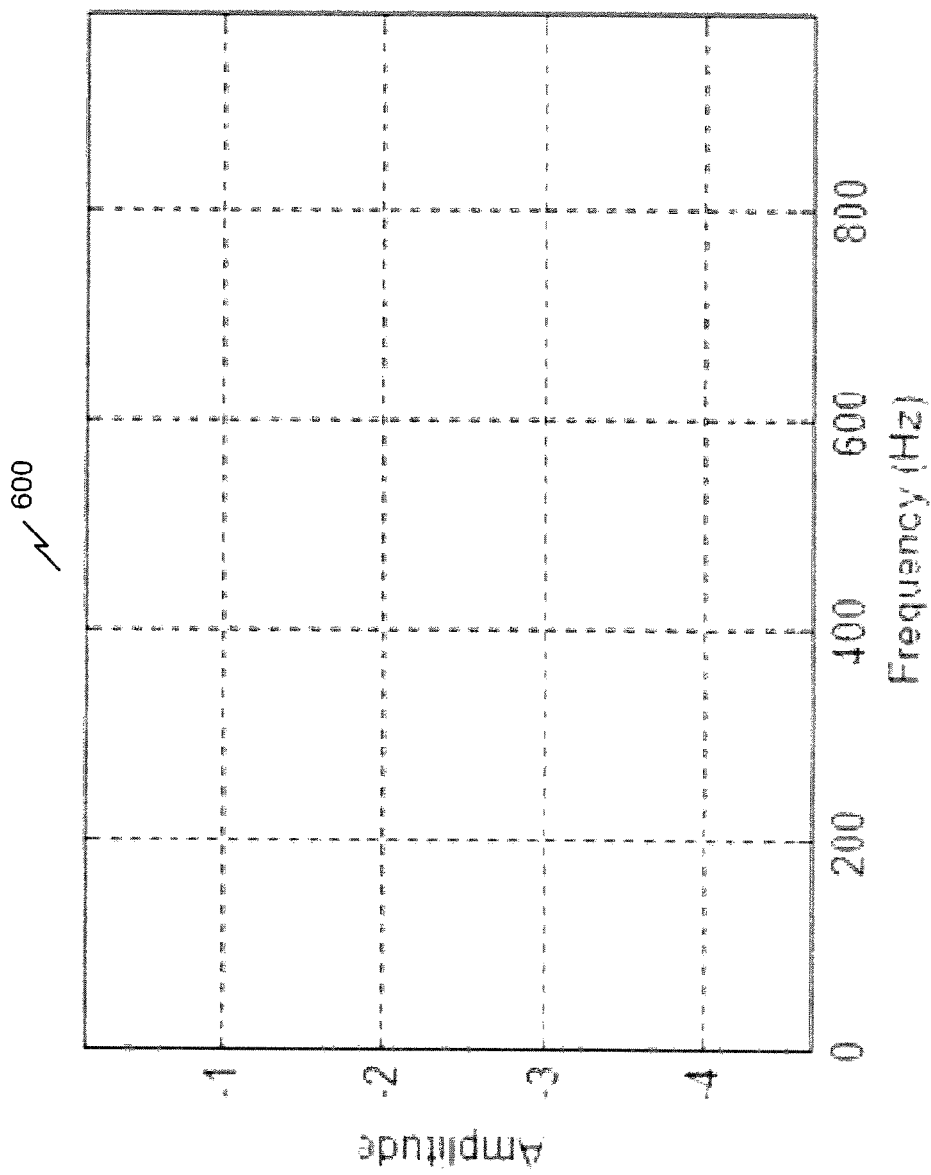
FIG. 6 illustrates an exemplary scope display for which a signal is out-of-range for x and y axes limits.

FIG. 6 illustrates an exemplary scope display for which a signal is out-of-range for x and y axes limits. A user viewing display 600 will not see traces 320, 325, 330, and 335 because all of the traces are out-of-range with respect to an upper limit and lower limit of display 600. An exemplary embodiment may detect that all traces are out-of-range and may rescale a scope display to render traces 320, 325, 330, and 335 to a user.

Figure 7:
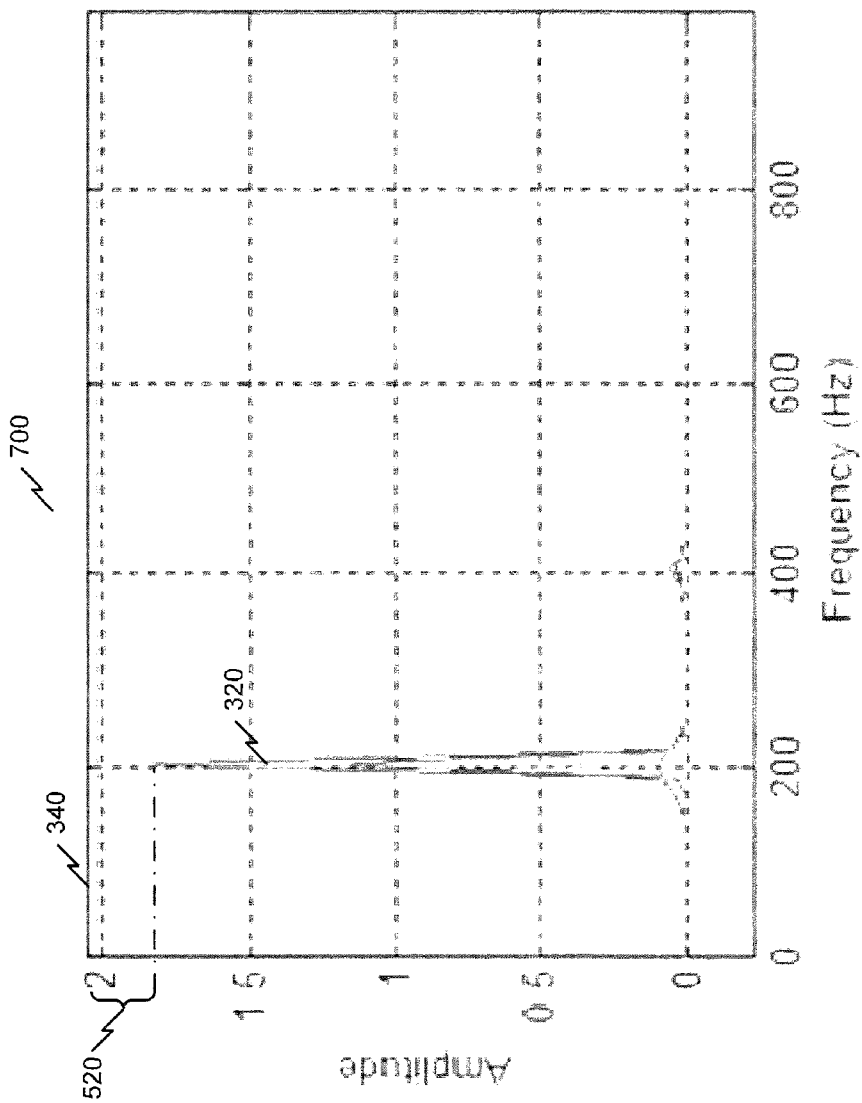
FIG. 7 illustrates the exemplary scope display of FIG. 6 when the y-axis has been autoscaled in accordance with an aspect of the invention.

FIG. 7 illustrates the exemplary scope display of FIG. 6 when the y-axis has been autoscaled in accordance with an aspect of the invention. The exemplary embodiment rescales a display area so that all four traces are visible to the user. Display 700 includes trace 320 redrawn so as to maintain limit margin 520 between a peak of trace 320 and upper limit 340. The embodiment of FIG. 7 determines limit margin 520 with respect to the highest amplitude in display 700; however, other embodiments may determine limit margin 520 from other peaks in display 700.

In some instances displayed data may occupy only a small portion of a display, thus making it hard for a user to identify characteristics of displayed data.

Figure 8:
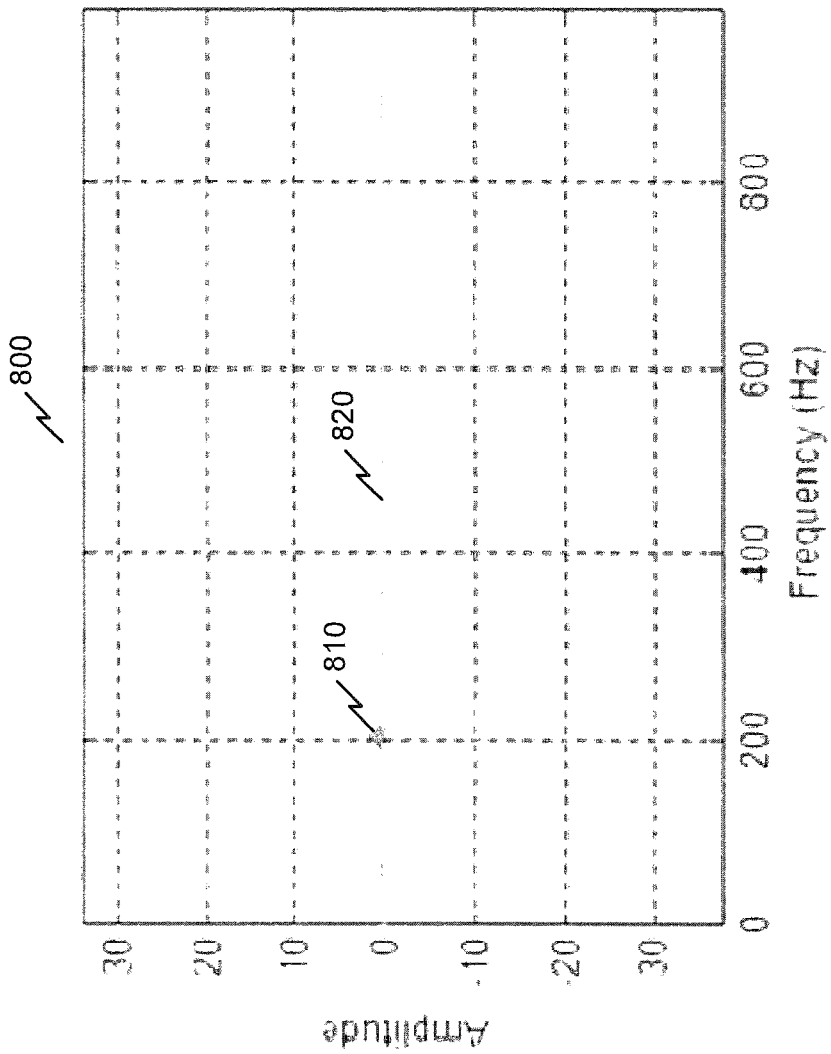
FIG. 8 illustrates an exemplary scope display that includes a signal occupying a small portion of an available amplitude limit.

FIG. 8 illustrates an exemplary scope display that includes a signal occupying a small portion of an available display area. For example, scope display 800 may include trace 810 that may occupy a small portion of an available display area. A user attempting to understand characteristics of trace 810 may be unable to discern information because of inadequate display resolution for trace 810. In an embodiment, display 800 may include centerline 820 that may indicate a center (e.g., a zero crossing) for an axis (e.g., the y-axis) of a display area.

An exemplary embodiment may be configured to autoscale display 800 when a signal, such as trace 810, occupies a certain amount of a display area. For example, autoscaling can occur when trace 810 occupies less than a certain percentage of a display area, when the peak amplitude of trace 810 is below a threshold value, etc.

Figure 9:
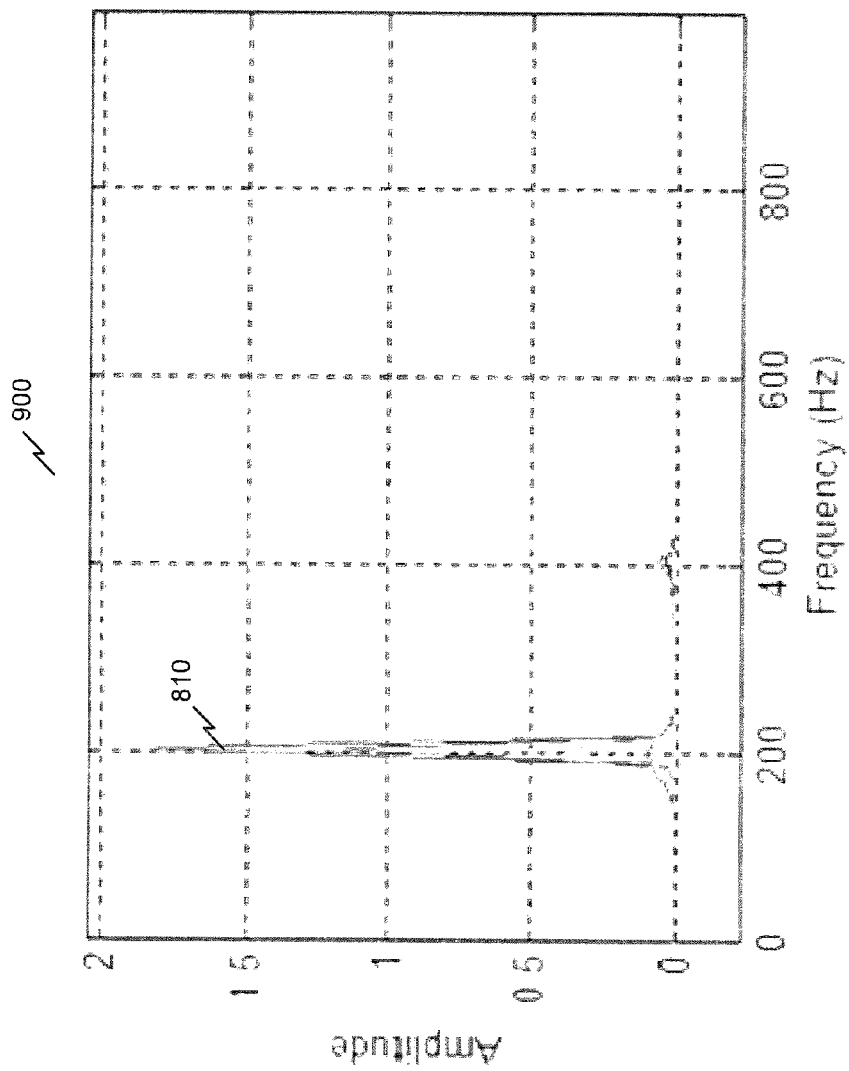
FIG. 9 illustrates the exemplary scope display of FIG. 8 when the y-axis has been autoscaled in accordance with an aspect of the invention.

FIG. 9 illustrates the exemplary scope display of FIG. 8 when the y-axis has been autoscaled in accordance with an aspect of the invention. Scope display 900 may display trace 810 after display 900 is autoscaled in accordance with aspects of the invention. Display 900 may be configured to autoscale such that trace 810 occupies a certain percentage of an available display area (e.g., 90%), that a determined value for a limit margin parameter is maintained between a peak amplitude of trace 810 and an upper limit of display 900, etc. The autoscaled version of trace 810 may allow a user to identify characteristics of trace 810 that the user could not identify when trace 810 occupied a small portion of display 800.

Exemplary embodiments may provide a user with interfaces for configuring aspects of scope displays that include autoscaling capabilities in accordance with aspects of the invention. For example, one or more GUI's may be provided to a user that allow the user to configure certain aspects of a scope display.

Figure 10:
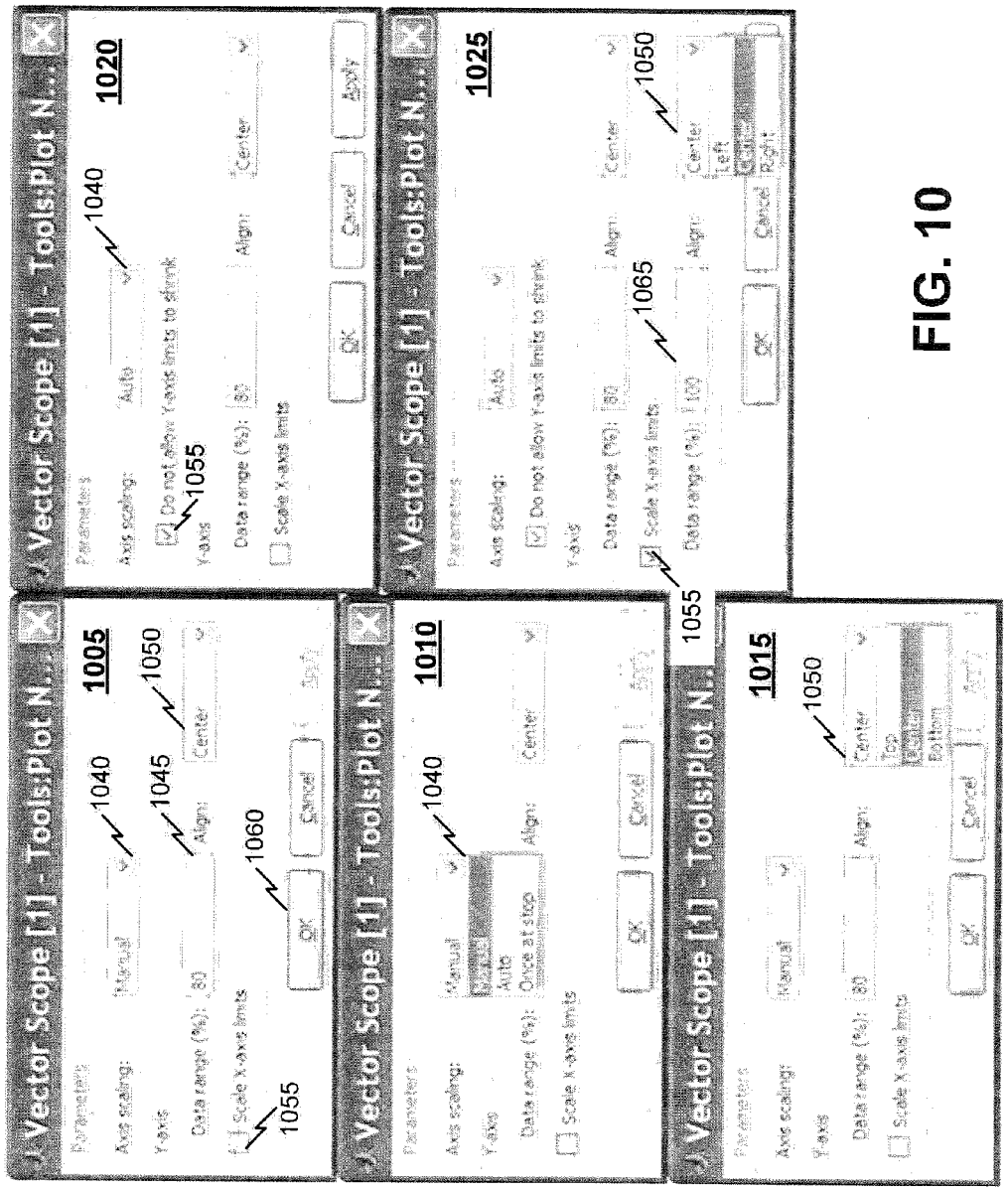
FIG. 10 illustrates exemplary user interfaces for configuring aspects of a scope display.

FIG. 10 illustrates exemplary interfaces (e.g., GUIs) for use in configuring aspects of a scope display. For example, a user may double click on a scope block in model and may be presented with one or more GUI's that allow the user to configure the scope. In an embodiment, a user may be presented with GUI 1005. The user may select axis scaling field 1040 to specify how an axis of the scope will be configured. GUI 1005 may further include data range field 1045 and alignment field 1050 for specifying characteristics of a y-axis of the scope. GUI 1005 may further include scale x-axis limits box 1055 that may be selected to provide scaling of an x-axis of the scope. GUI 1005 may still further include selection buttons 1060 for allowing a user to accept selections, cancel selections, or apply selections.

GUI 1010 illustrates an implementation of axis scaling field 1040. A user may select a drop down icon and a list of available axis scaling features may be provided to the user. For example, a user may select manual for allowing the user to specify scaling, auto for allowing computer 130 to specify axis scaling, or once at stop to provide axis scaling when model execution is paused.

GUI 1015 illustrates an implementation of alignment field 1050 that allows a user to specify whether a y-axis is aligned with respect to the top, center, or bottom of a scope display area.

GUI 1020 illustrates an implementation of axis scaling field 1040 that provides a user with a check box 1055 for indicating that the y-axis limits should not be allowed to shrink. In an embodiment, this feature may be available when auto has been specified for axis scaling field 1040. Specifying that axis limits should not shrink may limit autoscaling to one direction. For example, autoscaling may only be able to zoom in but not zoom out, or vice versa.

GUI 1025 illustrates an implementation that provides a user with selections when scale x-axis limits field has been selected. For example, the user may be provided with data range % field 1065 that allows a user to specify a percentage of a scope display that will be occupied by data along an x-axis. The user may also be provided with an alignment field 1050 that allows the user to specify left, center, or right alignment for the x-axis in a scope display.

Other embodiments of GUI's used with the invention can be configured in still other ways without departing from the spirit and scope of the invention.

Figure 11:
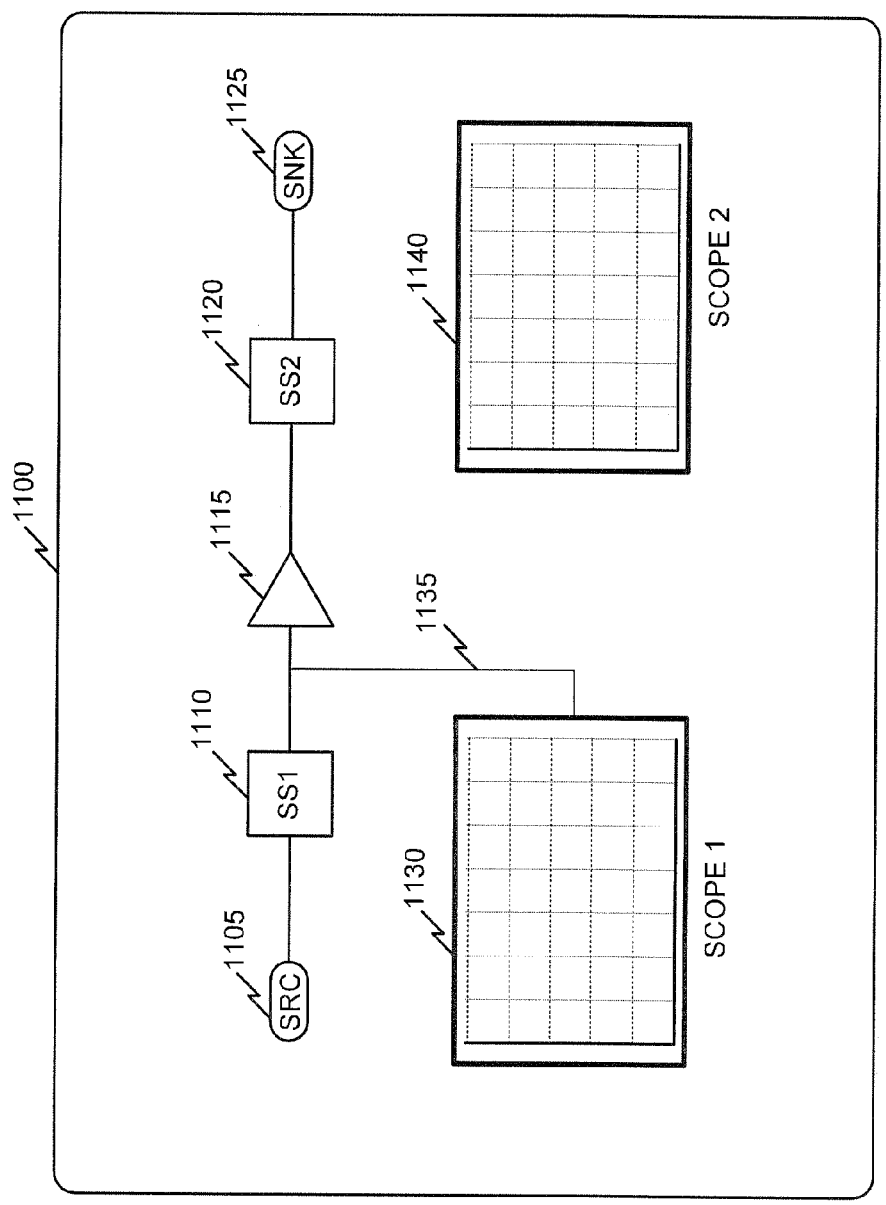
FIG. 11 illustrates an exemplary model that includes scopes for displaying signals in the model.

FIG. 11 illustrates an exemplary model that includes scopes for displaying signals in the model. Model 1100 may include source 1105, subsystem 1 (SS1) 1110, gain block 1115, subsystem 2 (SS2) 1120, sink 1125, scope 1 1130 and scope 2 1140.

Source 1105 may provide data to model 1100. For example, data may be read from a file, provided via another model, provided by an instrument, etc., to model 1100. SS1 1110 and SS2 1120 may be subsystems comprising two or more blocks that interact with each other to perform an operation. Subsystems may receive data, may process the data using blocks making up the subsystem and may generate a result that is provided to other blocks or subsystems in model 1100. Gain block 1115 may receive a signal and may multiply the signal by a constant to produce an amplified version of the input signal as an output signal. Sink 1125 may store data or may send data to a destination, such as a storage device, network, etc.

Scope 1 1130 and scope 2 1140 may be scope displays for use in displaying signals or other data in model 1100. Embodiments of scopes may be connected to other components in a model via lines 1135 or may be logically connected to model 1100 without the use of lines. For example, scope 2 1140 may receive signals from the output of SS2 1120 and may display the signals to a user without requiring that a line be drawn from the output of SS2 1120 to scope 2 1140.

Figure 12A:
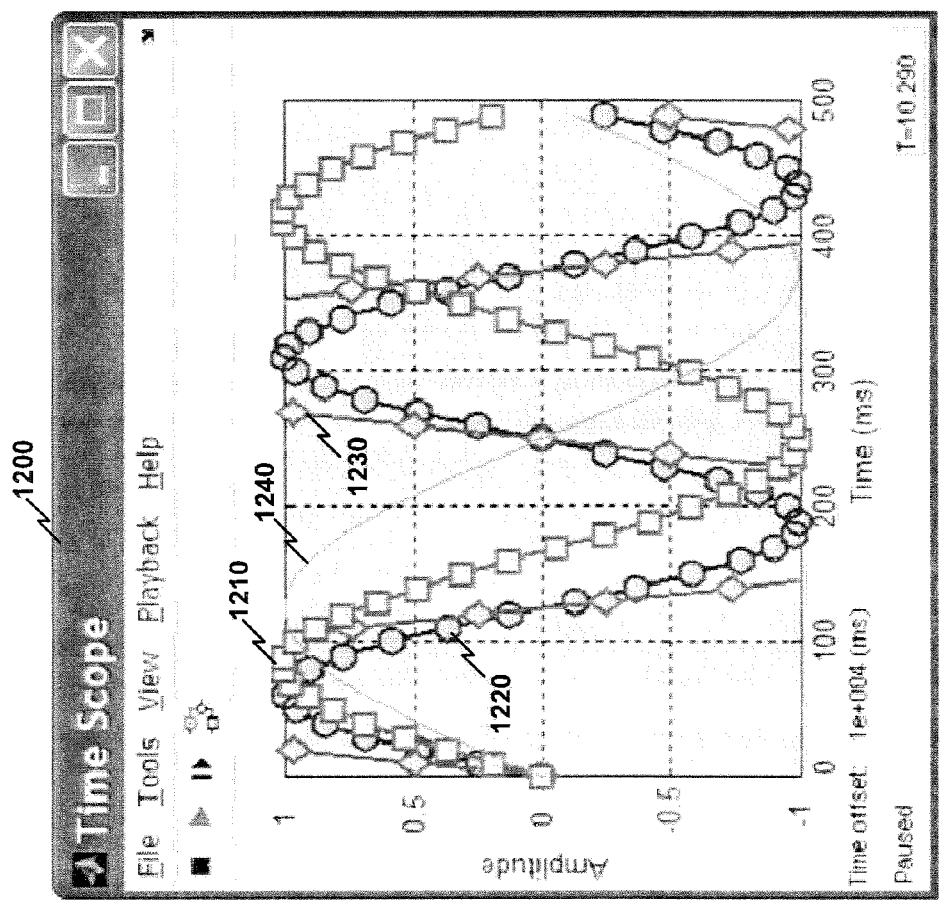
FIG. 12A illustrates an exemplary scope display containing signals using or exceeding available y-axis limits.

FIG. 12A illustrates an exemplary scope display containing signals using or exceeding available y-axis limits. Scope 1 1130 may receive output signals from SS1 1110 and may display the information to a user. For example, scope 1 1130 may include display 1200 that includes traces 1210, 1220, 1230, and 1240 displayed with respect to an x-axis and a y-axis. From FIG. 12A, it can be seen that trace 1210 and 1230 are clipped in that the full amplitude of traces 1210 and 1230 is not displayed within display 1200. An embodiment of the invention may determine that a certain number of samples are out of range for trace 1210 and/or 1230 and may autoscale display 1200.

Figure 12B:
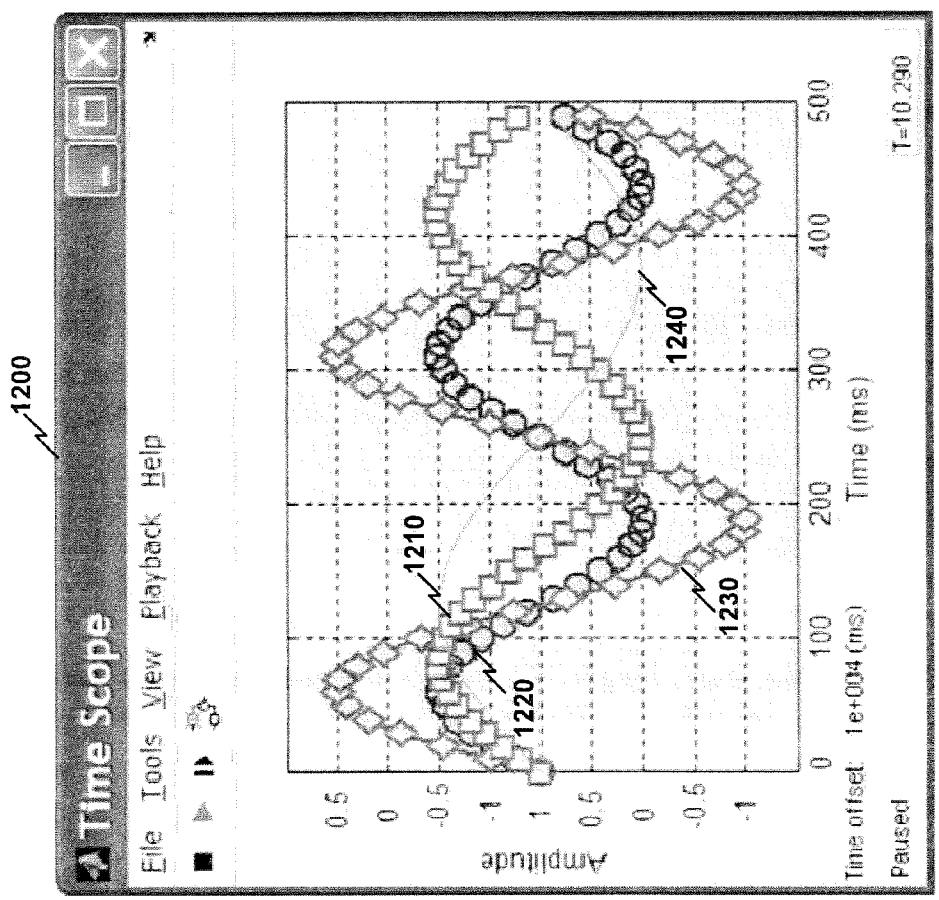
FIG. 12B illustrates the scope display of FIG. 12A when the y-axis limits have been autoscaled in accordance with an aspect of the invention.

FIG. 12B illustrates the scope display of FIG. 12A when the y-axis limits have been autoscaled in accordance with an aspect of the invention. Display 1200 may be autoscaled such that a determined amount of limit margin is available between maximum amplitude and minimum amplitude of a trace in display 1220 and an upper limit or lower limit of the display area.

Exemplary Processing

FIGS. 13A-13D illustrate exemplary processing for practicing an embodiment of the invention. The embodiment of FIGS. 13A-13D is exemplary and other embodiments can be configured in other ways without departing from the spirit of the invention.

Figure 13A:
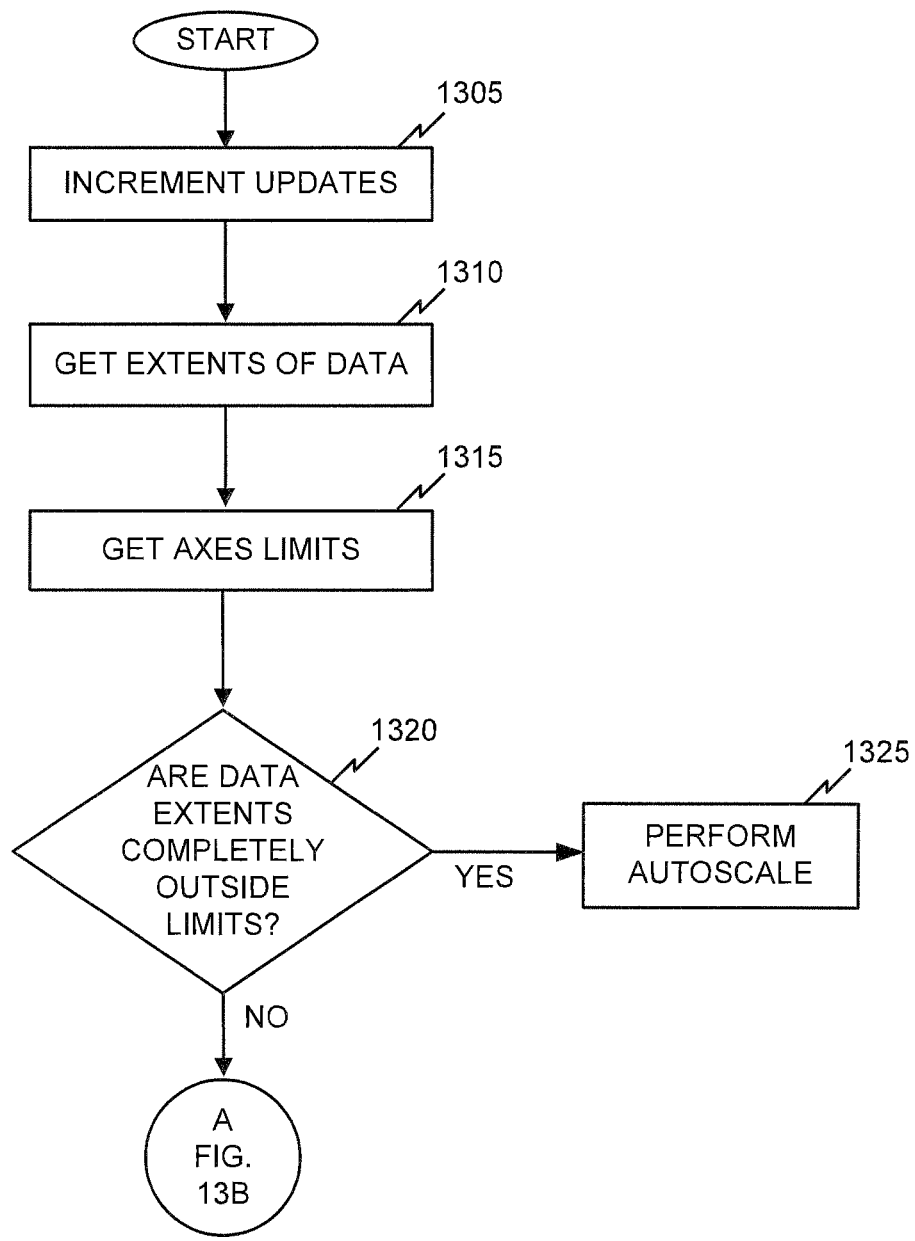
FIGS. 13A-13D illustrate exemplary processing for practicing an embodiment of the invention.

Referring to FIG. 13A, a scope block may be placed in a model and may be configured to receive signals from a block in the model. In a time-based model, the scope may receive samples that collectively represent a time-varying signal. The time-varying signals may continue to vary while a model executes. Other embodiments of the invention may include scope blocks, or other types of moving data display blocks, that can be used with other types of models, such as textual or graphical models representing event-based systems, dataflow-based systems, continuous systems, etc.

The exemplary embodiment described in connection with FIGS. 13A-D may make use of counters to track data received by a scope. For example, $T_O$ may be used to track data that exceeds an upper limit of a display (e.g., samples that exceed upper limit 340 of a display), $T_U$ may be used to track data that does not use more than a determined portion of an available display area, and $T_{UPDATES}$ may be used to track all data received by the scope.

When data (e.g., a sample) is received by a scope, an update counter may be incremented (act 1305). For example, $T_{UPDATES}$ may be incremented in an embodiment. The data may also be evaluated to determine the extents of the data (act 1310). For example, the evaluation may determine the amplitude of the data and a time value for the data. The amplitude may be referenced against a y-axis when the data is displayed and the time value may be represented against an x-axis when the data is displayed. Axis limits for the scope may be obtained (act 1315).

Processing may determine whether the data extents for the data are completely outside the axis limits for the display (act 1320). For example, axis limits may include an upper limit 340 and a lower limit 345 and the extents for the data may be compared to both limits do determine whether the data is completely outside the axes limits. When the data is completely outside the axes limits, autoscaling may be performed (act 1325). For example, data may not appear anywhere within an area of display 600 (FIG. 6). In this situation, the scope may immediately autoscale so that the data is visible on the display, such as is shown in FIG. 7. Embodiments may evaluate a single sample or may be performed with respect to a plurality of samples that collectively make up a trace, such as trace 320 (FIG. 7).

Figure 13B:
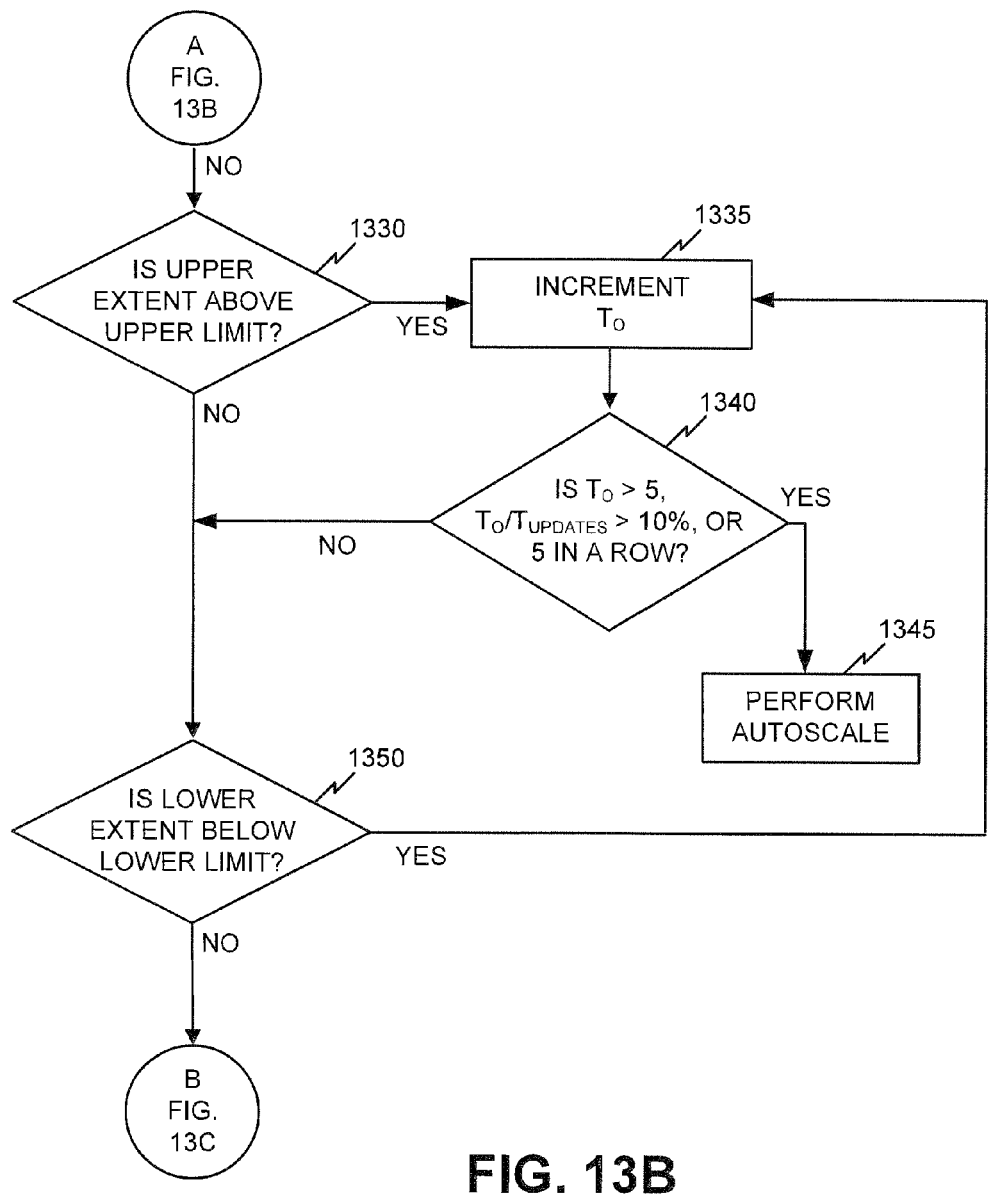

Referring now to FIG. 13B, when data extents are not completely outside the axes limits at act 1320, processing may determine whether an upper extent for the data is above upper limit 340 for an axis, such as a y-axis (act 1330). When the upper extent of the data exceeds upper limit 340, a counter may be incremented (act 1335). In an embodiment, an overrun counter, $T_O$, may be used to store information about a number of samples exceeding upper limit 340. When the upper extent for the data does not exceed upper limit 340, a determination may be made as to whether the data exceeds lower limit 345 (act 1350).

When the data extent exceeds lower limit 345, $T_O$ may be incremented via act 1335. Exemplary embodiments may be configured to perform autoscaling in a manner that represents an expected behavior of a typical user. For example, an embodiment may be configured to perform autoscaling in a manner that does not interfere with a user's ability to understand the behavior of a model. By way of example, once $T_O$ is incremented at act 1335, a determination may be made with respect to $T_O$ to determine whether a display should be autoscaled. In an embodiment, a determination may be made as to whether $T_O>5$ samples, $T_O/T_{UPDATES}>10\%$, or whether 5 samples in a row have exceeded upper extent 340 or lower extent 345 (act 1340). When one of the comparisons of act 1340 has been satisfied, the scope display may be autoscaled (act 1345).

Figure 13C:
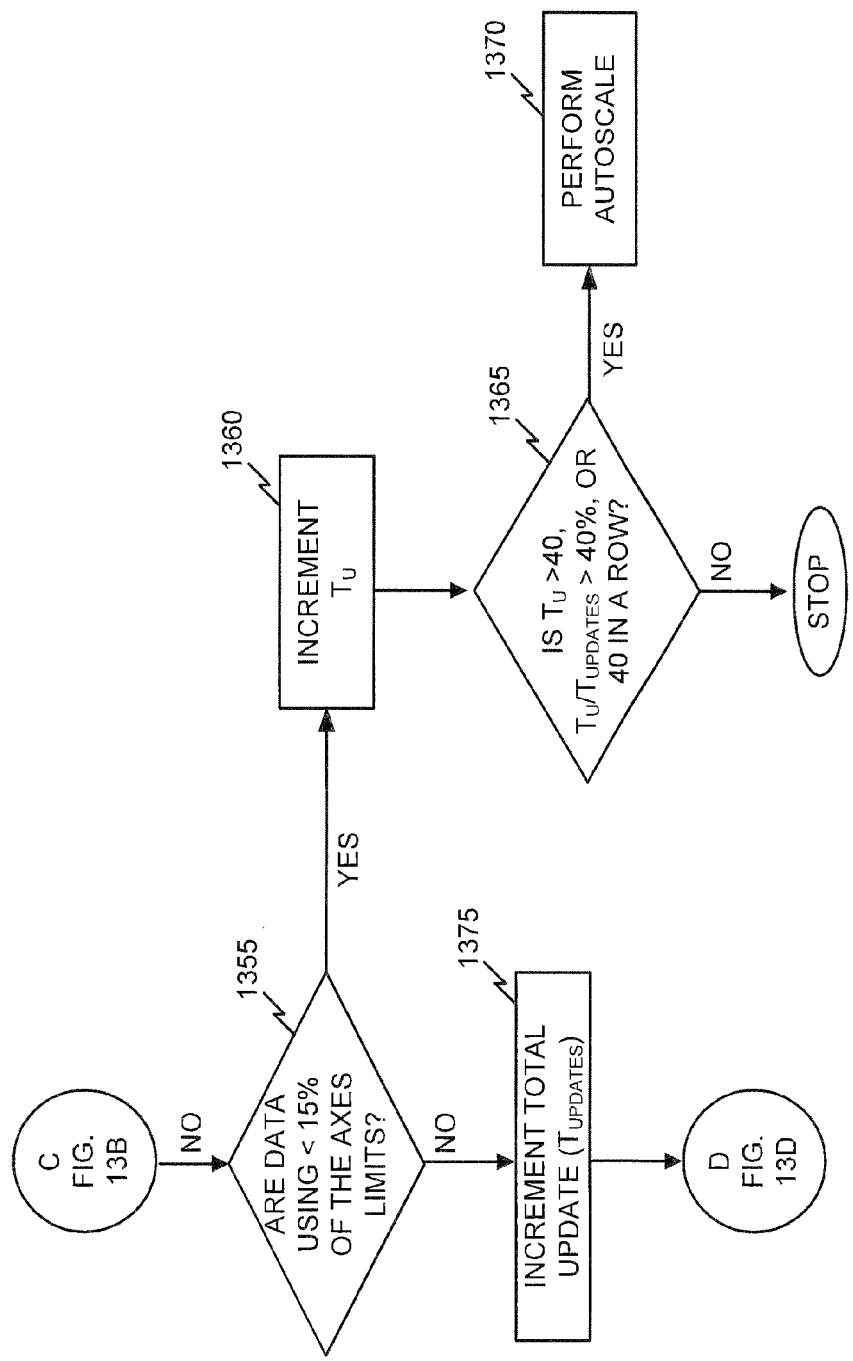

Referring now to FIG. 13C, when one of the comparisons of act 1340 has not been satisfied and when a lower extent of the data is not below lower limit 345, a determination may be made as to whether the data are using less than 15% of available axes limits (act 1355). An embodiment may use a ratio value to represent an amplitude of a sample with respect to a value of an amplitude axis on a scope. For example, in FIG. 8 it may be determined that data are using less than 15% of available x and y axes limits. When it is determined that data are using less than 15% of the available axes limits, an underrun counter, $T_U$, may be incremented (act 1360). In contrast, when the data are not using less than 15% of the available axes limits, an update counter, $T_{UPDATES}$, may be incremented (act 1375).

When the underrun counter is updated at act 1360, a determination may be made with respect to the underrun counter. For example, an embodiment may determine whether $T_U<40$, $T_U/T_{UPDATES}>40\%$, or whether 40 samples in a row occupy less than 15% of an available axes limits (act 1365). When none of the comparisons in act 1365 are satisfied, processing may stop. In contrast, when one or more of the comparisons of act 1365 is satisfied, the display may be autoscaled (act 1370).

Figure 13D:
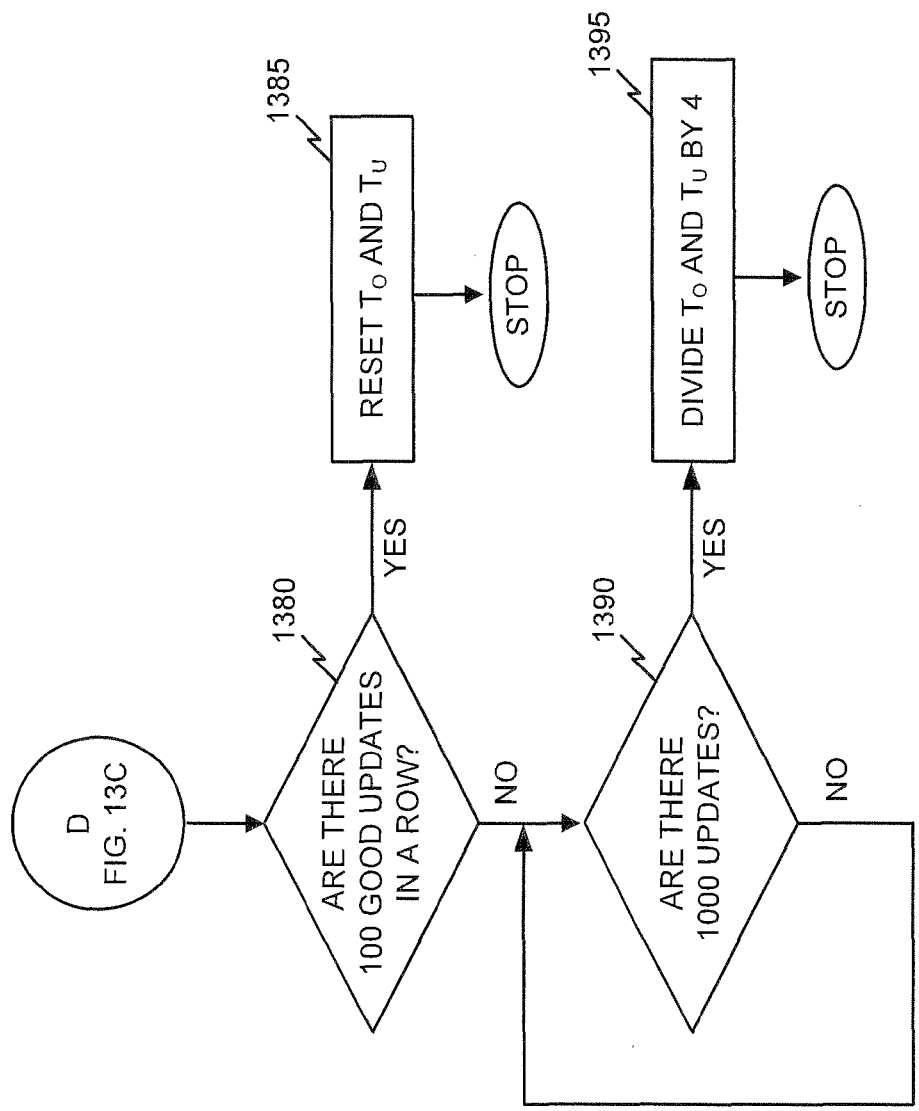

Referring now to FIG. 13D, after act 1375 (FIG. 13C) a determination may be made as to whether one hundred consecutive updates have been received that can be considered good updates (act 1380). In an embodiment, a good update may be an update that does not exceed upper extent 340, lower extent 345 and that occupy at least 15% of available axes limits. When one hundred good updates have been received consecutively, an underrun counter and an overrun counter may be reset (act 1385). In addition, the total update counter may be set to 100.

In contrast, when one hundred good updates have not been received consecutively, a determination may be made as to whether one thousand updates have been received (act 1390). In an embodiment, the one thousand updates may include overrun updates and underrun updates as well as good updates. When one thousand updates have been received, the current values of the overrun counter and underrun counter may be divided by an integer, such as 4 (act 1395). Dividing the counters by an integer may cause older data to be weighted less heavily when making determinations with respect to autoscaling a display. The value of the integer can be changed depending on how much weight should be given to recent data as compared to older data.

Exemplary Architecture

Figure 14:
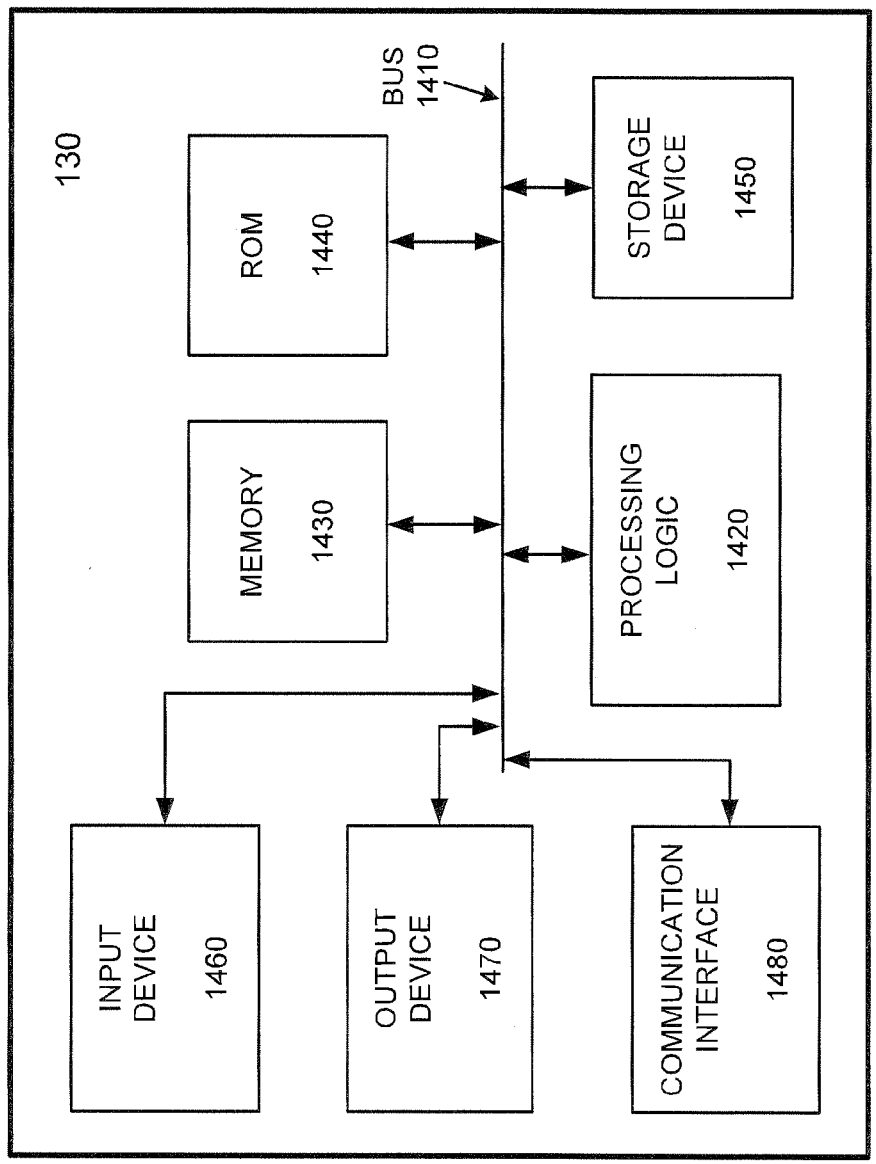
FIG. 14 illustrates an exemplary architecture for implementing the computer of FIG. 1.

FIG. 14 illustrates an exemplary computer architecture that can be used to implement computer 130 of FIG. 1. FIG. 14 is an exemplary diagram of an entity corresponding to computer 130. As illustrated, the entity may include a bus 1410, processing logic 1420, a main memory 1430, a read-only memory (ROM) 1440, a storage device 1450, an input device 1460, an output device 1470, and/or a communication interface 1480. Bus 1410 may include a path that permits communication among the components of the entity.

Processing logic 1420 may include a processor, microprocessor, or other types of processing logic (e.g., FPGA, GPU, DSP, ASIC, etc.) that may interpret and execute instructions. For an implementation, processing logic 1420 may include a single core processor or a multi-core processor. In another implementation, processing logic 1420 may include a single processing device or a group of processing devices, such as a processing cluster or computing grid. In still another implementation, processing logic 1420 may include multiple processors that may be local or remote with respect each other, and may use one or more threads while processing.

Main memory 1430 may include a random access memory (RAM) or another type of dynamic storage device that may store information and instructions for execution by processing logic 1420. ROM 1440 may include a ROM device or another type of static storage device that may store static information and/or instructions for use by processing logic 1420. Storage device 1450 may include a magnetic, solid state and/or optical recording medium and its corresponding drive, or another type of static storage device that may store static information and/or instructions for use by processing logic 1420.

Input device 1460 may include logic that permits an operator to input information to the entity, such as a keyboard, a mouse, a pen, a touchpad, an accelerometer, a microphone, voice recognition, camera, neural interface, biometric mechanisms, etc. In an embodiment, input device 1460 may correspond to input device 120.

Output device 1470 may include a mechanism that outputs information to the operator, including a display, a printer, a speaker, a haptic interface, etc. In an embodiment, output device 1470 may correspond to display 110. Communication interface 1480 may include any transceiver-like logic that enables the entity to communicate with other devices and/or systems. For example, communication interface 1480 may include mechanisms for communicating with another device or system via a network.

The entity depicted in FIG. 14 may perform certain operations in response to processing logic 1420 executing software instructions stored in a computer-readable storage medium, such as main memory 1430. A computer-readable storage medium may be defined as a physical or logical memory device. The software instructions may be read into main memory 1430 from another computer-readable storage medium, such as storage device 1450, or from another device via communication interface 1480. The software instructions contained in main memory 1430 may cause processing logic 1420 to perform techniques described herein when the software instructions are executed on processing logic. Alternatively, hardwired circuitry may be used in place of or in combination with software instructions to implement techniques described herein. Thus, implementations described herein are not limited to any specific combination of hardware circuitry and software.

Although FIG. 14 shows exemplary components of the entity, in other implementations, the entity may contain fewer, different, or additional components than depicted in FIG. 14. In still other implementations, one or more components of the entity may perform one or more tasks described as being performed by one or more other components of the entity.

Exemplary Distributed Embodiment

Distributed embodiments may perform processing using two or more processing resources. For example, embodiments can perform processing using two or more cores in a single processing device, distribute processing across multiple processing devices installed within a single enclosure, and/or distribute processing across multiple types of processing logic connected by a network.

Figure 15:
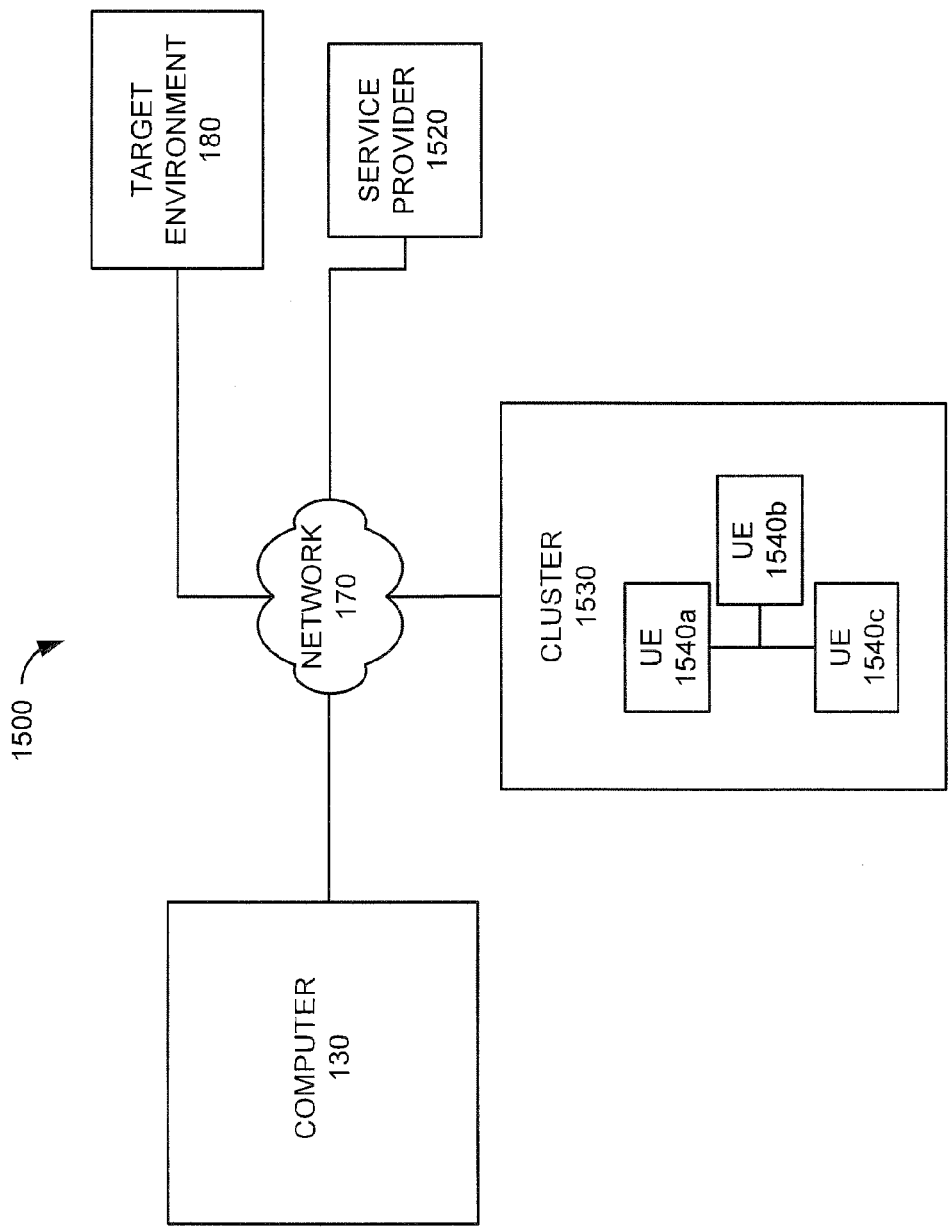
FIG. 15 illustrates an exemplary embodiment for implementing a distributed implementation of the invention.

FIG. 15 illustrates an exemplary system that can support distributed modeling applications that make use of autoscaling techniques disclosed herein. System 1500 may include computer 130, network 170, service provider 1520, and cluster 1530. The implementation of FIG. 15 is exemplary and other distributed implementations of the invention may include more devices and/or entities, fewer devices and/or entities, and/or devices/entities in configurations that differ from the exemplary configuration of FIG. 15.

Service provider 1520 may include a device that makes a service available to another device. For example, service provider 1520 may include an entity that provides one or more services to a destination using a server and/or other devices. Services may include instructions that are executed by a destination to perform an operation. Alternatively, a service may include instructions that are executed on behalf of a destination to perform an operation on the destination's behalf.

Assume, for sake of example, that a service provider operates a web server that provides one or more web-based services to a destination, such as computer 130. The web-based services may allow computer 130 to perform distributed simulations of electrical and/or mechanical systems using hardware that is operated by the service provider. For example, a user of computer 130 may be allowed to evaluate models side-by-side using the service provider's hardware. In an implementation, a customer (user) may receive services on a subscription basis. A subscription may include substantially any type of arrangement, such as monthly subscription, a per-use fee, a fee based on an amount of information exchanged between service provider 1520 and the customer, a fee based on a number of processor cycles used by the customer, a fee based on a number of processors used by the customer, etc.

Cluster 1530 may include a group of processing devices, such as units of execution 1540 that can be used to perform remote processing (e.g., distributed processing, parallel processing, etc.). Units of execution 1540 may include hardware and/or hardware/software based devices that perform processing operations on behalf of a requesting device, such as computer 130. In an embodiment, units of execution 1540 may each compute a partial result and the partial results can be combined into an overall result for a model.

Embodiments operating in a standalone or in a distributed implementation can perform activities described herein on code/results associated with text-based computing and/or modeling applications, such as, but not limited to, MATLAB® by The MathWorks, Inc.; Octave; Python; Comsol Script; MATRIXx from National Instruments; Mathematica from Wolfram Research, Inc.; Mathcad from Mathsoft Engineering & Education Inc.; Maple from Maplesoft; Extend from Imagine That Inc.; Scilab from The French Institution for Research in Computer Science and Control (INRIA); Virtuoso from Cadence; or Modelica or Dymola from Dynasim.

Embodiments can further perform activities described herein on code/results associated with graphical modeling environments, such as, but not limited to, Simulink®, Stateflow®, SimEvents™, etc., by The MathWorks, Inc.; VisSim by Visual Solutions; LabView® by National Instruments; Dymola by Dynasim; SoftWIRE by Measurement Computing; WiT by DALSA Coreco; VEE Pro or SystemVue by Agilent; Vision Program Manager from PPT Vision; Khoros from Khoral Research; Gedae by Gedae, Inc.; Scicos from (INRIA); Virtuoso from Cadence; Rational Rose from IBM; Rhapsody or Tau from International Business Machines (IBM) Corporation; Ptolemy from the University of California at Berkeley; ASCET, CoWare, or aspects of a Unified Modeling Language (UML) or SysML environment. Graphical modeling environments can include block diagrams and/or other types of diagrams.

Embodiments may be implemented in a variety computing environments, such as environments that support statically or dynamically typed programming languages. For example, a dynamically typed language may be one used to express problems and/or solutions in mathematical notations familiar to those of skill in the relevant arts. For example, the dynamically typed language may use an array as a basic element, where the array may not require dimensioning. These arrays may be used to support array programming in that operations can apply to an entire set of values, such as values in an array. Array programming may allow array based operations to be treated as a high-level programming technique or model that lets a programmer think and operate on whole aggregations of data without having to resort to explicit loops of individual non-array, i.e., scalar operations. An exemplary embodiment that uses a dynamically typed language may be implemented in the Embedded MATLAB programming language that can be used to create code for use in embedded applications.

CONCLUSION

Implementations may allow moving data displays to autoscale in a manner that approximates the behavior of a user.

The foregoing description of exemplary embodiments of the invention provides illustration and description, but is not intended to be exhaustive or to limit the invention to the precise form disclosed. Modifications and variations are possible in light of the above teachings or may be acquired from practice of the invention. For example, while a series of acts has been described with regard to FIGS. 13A-D, the order of the acts may be modified in other implementations consistent with the principles of the invention. Further, non-dependent acts may be performed in parallel.

In addition, implementations consistent with principles of the invention can be implemented using devices and configurations other than those illustrated in the figures and described in the specification without departing from the spirit of the invention. For example, devices and/or entities may be added and/or removed from the implementations of FIG. 1, 2, 14, or 15 depending on specific deployments and/or applications. Further, disclosed implementations may not be limited to any specific combination of hardware.

Further, certain portions of the invention may be implemented as "logic" that performs one or more functions. This logic may include hardware, such as hardwired logic, an application-specific integrated circuit, a field programmable gate array, a microprocessor, software, or a combination of hardware and software.

No element, act, or instruction used in the description of the invention should be construed as critical or essential to the invention unless explicitly described as such. Also, as used herein, the article "a" is intended to include one or more items. Where only one item is intended, the term "one" or similar language is used. Further, the phrase "based on," as used herein is intended to mean "based, at least in part, on" unless explicitly stated otherwise.

Headings and sub-headings used herein are to aid the reader by dividing the specification into subsections. These headings and sub-headings are not to be construed as limiting the scope of the invention or as defining the invention.

The scope of the invention is defined by the claims and their equivalents.

What is claimed is:

1. One or more non-transitory computer-readable media storing:
    one or more executable instructions that when executed on processing logic, cause the processing logic to:
        detect a value representing an amplitude for a given sample, where:
            the given sample is one of a plurality of samples, and
            the plurality of samples represents a portion of a moving data series;
        determine when the value representing the amplitude for the given sample:
            exceeds a maximum limit for a display, or
            exceeds a minimum limit for the display;
        count the given sample as an over-run when the value representing the amplitude for the given sample:
            exceeds the maximum limit, or
            exceeds the minimum limit;
        update an over-run counter when the given sample is counted as the over-run;
        compare a current value of the over-run counter to a counter threshold value to determine whether a display is to be autoscaled, where:
            the counter threshold value indicates a total number of updates, and
            the total number of updates reflects ones of the plurality of samples counted as over-runs and ones of the plurality of samples having amplitudes that are between the maximum limit and the minimum limit;
        determine, based on the comparing, that the display is to be autoscaled when:
            the current value of the over-run counter is at least a determined fraction of the counter threshold value, where:
                the autoscaling modifies the maximum limit or the minimum limit based on the value representing the amplitude for the given sample;
        autoscale the display based on the counter threshold value; and
        display the plurality of samples on the display with respect to an autoscaled axis.

2. The media of claim 1, where the plurality of samples are displayed on a scope in a graphical model.

3. The media of claim 1, where the moving data series is used in an executable model.

4. The media of claim 1, where recent data is weighted with respect to historical data.

5. The media of claim 1, where statistics associated with the moving data series are reset when a determined number of consecutive samples have amplitudes between the maximum limit and the minimum limit.

6. The media of claim 1, where the autoscaling is configured to maintain the maximum limit a determined amount above one or more of the values of the plurality of samples when the displaying is performed.

7. One or more non-transitory computer-readable media storing:
    one or more executable instructions that when executed on processing logic, cause the processing logic to:
        detect a value representing an amplitude for a given sample, where:
            the given sample is one of a plurality of samples, and
            the plurality of samples represents a portion of a moving data series;
        determine when the value representing the amplitude for the given sample is less than or equal to a ratio value, where the ratio value represents the value representing the amplitude for the given sample with respect to a maximum value and a minimum value of an amplitude axis;
        count the given sample as an under-run when the value representing the amplitude for the given sample is less than or equal to the ratio value;
        update an under-run counter when the given sample is counted as the under-run;
        compare a current value of the under-run counter to a counter threshold value to determine whether a display is to be autoscaled, where:
            the counter threshold value indicates a total number of updates, and the total number of updates reflects ones of the plurality of samples counted as under-runs and ones of the plurality of samples having amplitudes that are within the maximum limit and the minimum limit;
        determine, based on the comparing, that the display is to be autoscaled when:
            the current value of the under-run counter is at least a determined fraction of the counter threshold value, where:
                the autoscaling modifies the maximum limit or the minimum limit based on the value representing the amplitude for the given sample;
        autoscale the display based on the current value of the under-run counter; and
        display the plurality of samples on the display with respect to an autoscaled axis.

8. The media of claim 7, further storing:
    one or more executable instructions that when executed on the processing logic, cause the processing logic to:
        configure aspects of an algorithm that performs the autoscaling.

9. The media of claim 8, where the configuring is performed using a graphical user interface.

10. The media of claim 7, where the plurality of samples are displayed on a scope in a graphical model.

11. The media of claim 7, further storing:
    one or more instructions that when executed on the processing logic, cause the processing logic to:
        generate code for performing the autoscaling.

12. A computer-implemented method comprising:
    coupling a scope to a graphical model, where the coupling allows the scope to receive a signal from the graphical model;

receiving the signal, where the signal represents moving data in the graphical model, and where the moving data is comprised of a plurality of samples;
autoscaling the scope in response to one of:
an over-run event, or
an under-run event,
where autoscaling the scope in response to the over-run event comprises:
counting a given sample among the plurality of samples as an over-run when the given sample:
exceeds a maximum limit of the scope, or
exceeds a minimum limit of the scope;
updating an over-run counter when the given sample is counted as the over-run;
comparing a current value of the over-run counter to a counter threshold value to determine whether a display is to be autoscaled, where:
the counter threshold value indicates a total number of updates, where the total number of updates reflects ones of the plurality of samples counted as over-runs and ones of the plurality of samples having amplitudes that are between the maximum limit and the minimum limit;
determining, based on the comparing, that the display is to be autoscaled when the current value of the over-run counter is a determined fraction of the counter threshold value, where the autoscaling modifies the maximum limit or the minimum limit based on the value of the sample;
autoscaling the scope based on the current value of the over-run counter; and
displaying the plurality of samples on the scope with respect to an autoscaled axis; and
where the autoscaling the scope in response to the under-run event comprises:
determining when an amplitude of the given sample is less than or equal to a ratio value, where the ratio value represents the amplitude of the given sample with respect to a maximum value and a minimum value of an amplitude axis of the scope;
counting the given sample as an under-run when the given sample is less than or equal to the ratio value;
updating an under-run counter when the given sample is counted as an under-run;
comparing a current value of the under-run counter to the counter threshold value to determine whether the display is to be autoscaled;
determining, based on the comparing, that the display is to be autoscaled when the current value of the under-run counter is at least a determined fraction of the counter threshold value, where the autoscaling modifies the maximum limit or the minimum limit based on the given sample;
autoscaling the display based on the current value of the under-run counter; and
redisplaying the plurality of samples on the scope with respect to the autoscaled axis.

13. The method of claim 12, further comprising:
generating code for the scope.

14. The method of claim 12, where recent data is weighted with respect to historical data.

15. The method of claim 12, where statistics associated with the moving data series are reset when a determined number of consecutive samples have amplitudes between the maximum limit and the minimum limit.

16. The method of claim 12, where:
the autoscaling is configured to maintain the maximum limit a determined amount above one or more of the values of the plurality of samples when the displaying is performed, and
the autoscaling is configured to maintain the minimum limit a determined amount below one or more of the values of the plurality of samples when the redisplaying is performed.

17. A device, comprising:
a memory for:
storing axes information for a scope, where the axes information includes a maximum limit and a minimum limit; and
a processor executing instructions for:
coupling the scope to a graphical model, where the coupling allows the scope to receive a signal from the graphical model;
receiving the signal, where the signal represents moving data in the graphical model, and where the moving data is comprised of a plurality of samples;
autoscaling the scope in response to one of:
an over-run event, or
an under-run event,
where autoscaling the scope in response to the over-run event comprises:
counting a given sample among the plurality of samples as an over-run when the sample:
exceeds the maximum limit of the scope, or
exceeds the minimum limit of the scope;
updating an over-run counter when the given sample is counted as the over-run;
comparing a current value of the over-run counter to a counter threshold value to determine whether a display is to be autoscaled, where:
the counter threshold value indicates a total number of updates, and
the total number of updates reflects ones of the plurality of samples counted as over-runs and ones of the plurality of samples having amplitudes that are between the maximum limit and the minimum limit;
determining, based on the comparing, that the display is to be autoscaled when the current value of the over-run counter is a determined fraction of the counter threshold value, where the autoscaling modifies the maximum limit or the minimum limit based on the given sample;
autoscaling the display of the scope based on the current value of the over-run counter; and
displaying the plurality of samples on the scope display with respect to an autoscaled axis; and
where the autoscaling the scope in response to the under-run event comprises:
determining when an amplitude of the given sample is less than or equal to a ratio value, where the ratio value represents the amplitude of the given sample with respect to a maximum value and a minimum value of an amplitude axis of the scope;
counting the given sample as an under-run when the given sample is less than or equal to the ratio value;
updating an under-run counter when the given sample is counted as the under-run;
comparing a current value of the under-run counter to the counter threshold value to determine whether the display is to be autoscaled;

determining, based on the comparing, that the display is to be autoscaled when the current value of the under-run counter is at least a determined fraction of the counter threshold value, where the autoscaling modifies the maximum limit or the minimum limit based on the sample;

autoscaling the display based on the current value of the under-run counter; and redisplaying the plurality of samples on the scope with respect to the autoscaled axis.

* * * * *